(12) United States Patent
Saito et al.

(10) Patent No.: US 9,472,398 B2
(45) Date of Patent: Oct. 18, 2016

(54) METHOD OF MANUFACTURING SEMICONDUCTOR DEVICE AND SUBSTRATE PROCESSING APPARATUS

(71) Applicant: Hitachi Kokusai Electric, Inc., Tokyo (JP)

(72) Inventors: Tatsuyuki Saito, Toyama (JP); Masanori Sakai, Takaoka (JP); Yukinao Kaga, Toyama (JP); Takashi Yokogawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/723,774

(22) Filed: May 28, 2015

(65) Prior Publication Data
US 2015/0262816 A1    Sep. 17, 2015

Related U.S. Application Data

(63) Continuation of application No. 12/849,398, filed on Aug. 3, 2010.

(30) Foreign Application Priority Data

Aug. 4, 2009  (JP) ................. 2009-181637
Jul. 15, 2010  (JP) ................. 2010-160873

(51) Int. Cl.
*H01L 21/02*    (2006.01)
*C23C 16/34*    (2006.01)
*C23C 16/455*   (2006.01)
*C23C 16/52*    (2006.01)
*H01L 21/285*   (2006.01)

(52) U.S. Cl.
CPC .......... *H01L 21/0228* (2013.01); *C23C 16/34* (2013.01); *C23C 16/45523* (2013.01); *C23C 16/45544* (2013.01); *C23C 16/45563* (2013.01); *C23C 16/52* (2013.01); *H01L 21/02104* (2013.01); *H01L 21/02172* (2013.01); *H01L 21/02225* (2013.01); *H01L 21/02263* (2013.01); *H01L 21/02271* (2013.01); *H01L 21/28506* (2013.01)

(58) Field of Classification Search
CPC .................. H01L 21/02104; H01L 21/02172; H01L 21/02225; H01L 21/02263; H01L 21/02271; H01L 21/0228
See application file for complete search history.

(56) References Cited

U.S. PATENT DOCUMENTS

| | | | |
|---|---|---|---|
| 8,101,521 B1* | 1/2012 | Gao | C23C 16/0281 257/E21.16 |
| 2006/0128127 A1* | 6/2006 | Seo | C23C 16/34 438/584 |
| 2011/0065287 A1* | 3/2011 | Wajda | H01L 21/02148 438/785 |

*Primary Examiner* — Eduardo A Rodela
(74) *Attorney, Agent, or Firm* — Brundidge & Stanger, P.C.

(57) ABSTRACT

There are provided a method of manufacturing a semiconductor device, a substrate processing apparatus, and a semiconductor device. The method allows rapid formation of a conductive film, which has a low concentration of impurities permeated from a source owing to its dense structure, and a low resistivity. The method is performed by simultaneously supplying two or more kinds of sources into a processing chamber to form a film on a substrate placed in the processing chamber. The method comprises: performing a first source supply process by supplying at least one kind of source into the processing chamber at a first supply flow rate; and performing a second source supply process by supplying the at least one kind of source into the processing chamber at a second supply flow rate different from the first supply flow rate.

6 Claims, 11 Drawing Sheets

METHOD OF MANUFACTURING SEMICONDUCTOR DEVICE AND SUBSTRATE PROCESSING APPARATUS

CROSS-REFERENCE TO RELATED PATENT APPLICATION

This U.S. non-provisional patent application is a continuation of U.S. patent application Ser. No. 12/849,398, filed Aug. 3, 2010; claims priority under 35 U.S.C. §119 of Japanese Patent Applications No. 2009-181637, filed on Aug. 4, 2009 and No. 2010-160873, filed on Jul. 15, 2010, in the Japanese Patent Office, the entire contents of which are hereby incorporated by reference.

BACKGROUND OF THE INVENTION

1. Field of the Invention

The present invention relates to a method of manufacturing a semiconductor device, a substrate processing apparatus, and a semiconductor device. More particularly, the present invention relates to a method of manufacturing a semiconductor device, the method including a process of forming a conductive film or an insulating film on a substrate (wafer) by using a metal halide compound or an organic metal compound as a source, a substrate processing apparatus configured to form a metal film or a metal compound film on a substrate, and a semiconductor device.

2. Description of the Related Art

As a method of forming a predetermined film on a substrate, there is a chemical vapor deposition (CVD) method. In a CVD method, two or more sources are caused to react with each other in a gaseous state or on the surface of a substrate to form a film including elements of source molecules on the substrate. As another method of forming a predetermined film on a substrate, there is an atomic layer deposition (ALD) method. In an ALD method, two or more film-forming sources are alternately supplied to a substrate under predetermined film formation conditions (temperature, time, etc.), and the sources are adsorbed on the substrate on an atomic layer basis to form a film by a surface reaction. As compared with a conventional CVD method, a process can be performed at a lower substrate temperature (process temperature), and the thickness of a film formed on the substrate can be controlled by adjusting the execution number of a film-forming cycle.

As an example of a conductive film that can be formed on a substrate, Patent document 1 discloses a titanium nitride (TiN) film. In addition, there are examples of other conductive films such as a Ta film, an Al film, a W film, a Mn film, a film made of a nitride thereof, and a Ti film. In addition, examples of insulating films include a Hf, Zr, or Al oxide film, and a nitride film.

[Patent Document 1] International Publication No. WO2007/020874

When a titanium nitride film is formed on a substrate as a conductive film, for example, titanium tetrachloride ($TiCl_4$) may be used as a titanium (Ti)-containing source, and ammonia ($NH_3$) may be used as a nitriding gas. However, if a titanium nitride film is formed by a CVD method, as compared with the case of forming a titanium nitride film by an ALD method, problems such as high resistivity may be caused, for example, because chlorine (Cl) easily permeates the film.

On the other hand, if a continuous titanium nitride film is formed by an ALD method, as compared with the case where a titanium nitride film formed by a CVD method, the surface of the titanium nitride film may be smooth, and the resistance of the titanium nitride film may be relatively low. In addition, satisfactory step coverage may be obtained. However, since the film growth rate is low as compared with the case of using a CVD method, it takes time to obtain a desired film thickness, and thermal budge of a substrate increases.

SUMMARY OF THE INVENTION

An object of the present invention is to provide a method of manufacturing a semiconductor device, a substrate processing apparatus, and a semiconductor device. The method allows rapid formation of a conductive film, which has a low concentration of impurities permeated from a source owing to its dense structure, and a low resistivity.

According to an aspect of the present invention, there is provided a method of manufacturing a semiconductor device by simultaneously supplying a first source gas and a second source gas into a processing chamber to form a film on a substrate placed in the processing chamber, the method comprising: (a) supplying the second source gas into the processing chamber at a second flow rate while supplying the first source gas into the processing chamber at a first flow rate to form a first film on the substrate; and (b) supplying the second source gas into the processing chamber at a fourth flow rate lower than the second flow rate while supplying the first source gas into the processing chamber at a third flow rate lower than the first flow rate to form a second film on the substrate, wherein the step (a) through the step (b) are sequentially performed.

According to another aspect of the present invention, there is provided a substrate processing apparatus comprising: a processing chamber configured to accommodate a substrate; a source supply system configured to supply a first source gas and a second source gas into the processing chamber; and a control unit configured to control the source supply system to perform: (a) supplying the second source gas into the processing chamber at a second flow rate while supplying the first source gas into the processing chamber at a first flow rate to form a first film on the substrate; and (b) supplying the second source gas into the processing chamber at a fourth flow rate lower than the second flow rate while supplying the first source gas into the processing chamber at a third flow rate lower than the first flow rate to form a second film on the substrate, wherein the step (a) through the step (b) are sequentially performed.

According to another aspect of the present invention, there is provided a semiconductor device manufactured by a semiconductor device manufacturing method in which two or more kinds of sources are simultaneously supplied into a processing chamber to form a film on a substrate placed in the processing chamber, the method comprising: performed a first source supply process by supplying at least one kind of source into the processing chamber at a first supply flow rate; and performing a second source supply process by supplying the at least one kind of source into the processing chamber at a second supply flow rate different from the first supply flow rate.

DETAILED DESCRIPTION OF THE PREFERRED EMBODIMENTS

Hereinafter, preferred embodiments of the present invention will be explained with reference to the attached drawings.

A substrate processing apparatus of the current embodiment is configured as an example of a semiconductor manufacturing apparatus used to fabricate semiconductor devices (integrated circuits, ICs). In the following description, an explanation will be given on a vertical apparatus as an example of the substrate processing apparatus configured to perform a process such as a film forming process on a substrate. However, the present invention is not limited to the use of the vertical type apparatus. For example, the present invention can be applied to a single wafer type apparatus.

<Overall Structure of Apparatus>

Figure 1:
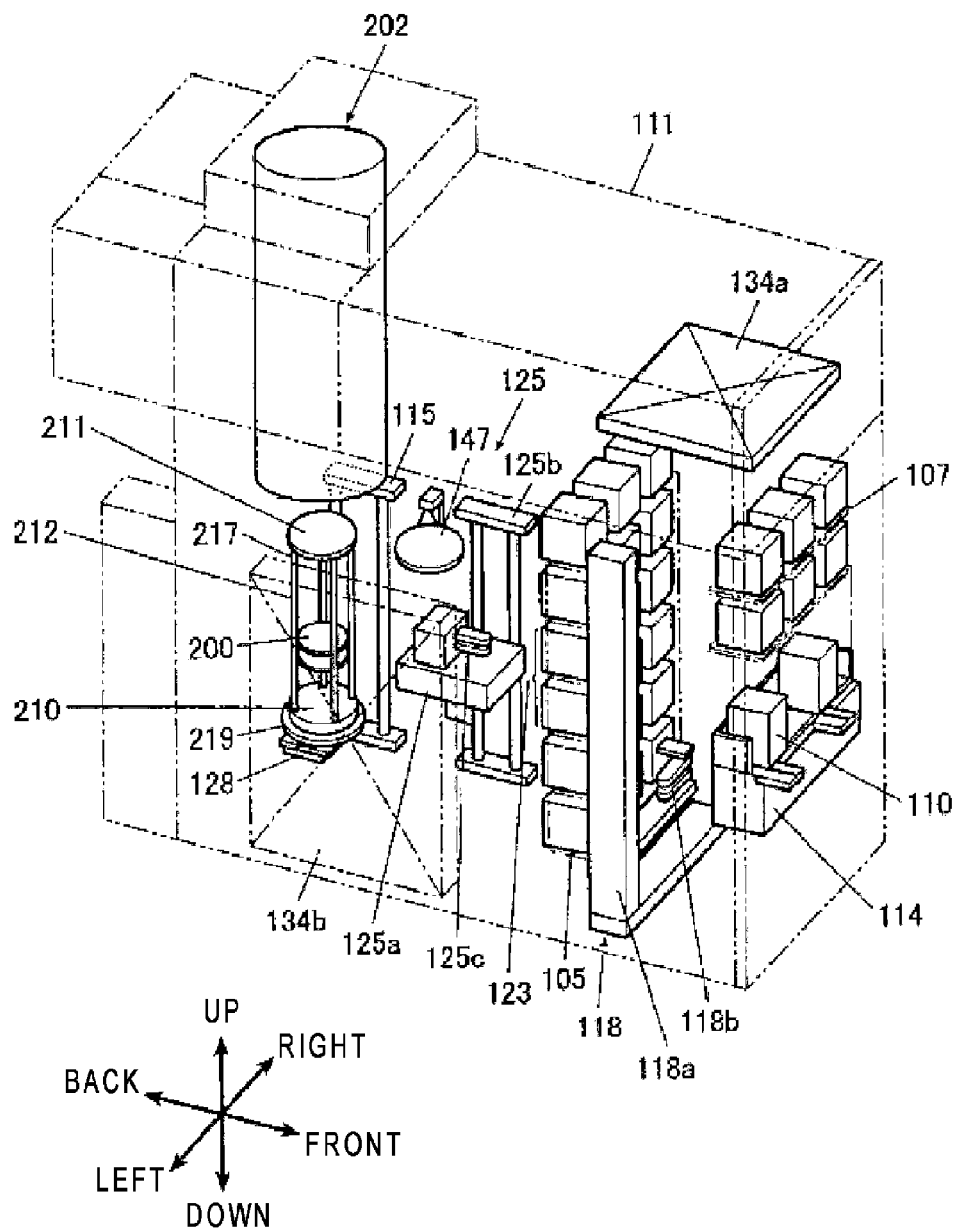
FIG. 1 is a schematic perspective view illustrating a substrate processing apparatus that can be properly used according to an embodiment of the present invention.

As shown in FIG. 1, in a substrate processing apparatus 101, cassettes 110 are used to accommodate substrates such as wafers 200. The wafers 200 are made of a material such as silicon. The substrate processing apparatus 101 includes a case 111. In the case 111, a cassette stage 114 is installed.

The cassettes 110 are configured to be carried onto the cassette stage 114, or carried away from the cassette stage 114, by an in-process carrying device (not shown).

On the cassette stage 114, a cassette 110 is placed by the in-process carrying device in a manner such that wafers 200 are vertically positioned in the cassette 110 and a wafer entrance of the cassette 110 is pointed upward. The cassette stage 114 is configured so that the cassette 110 is rotated 90° counterclockwise in a longitudinal direction to the backward of the case 111 so as to horizontally orient the wafers 200 of the cassette 110 and point the wafer entrance of the cassette 110 to the backward of the case 111.

Near the inner center part of the case 111 in a front-to-back direction, a cassette shelf 105 is installed. The cassette shelf 105 is configured to store a plurality of the cassettes 110 in a plurality of stages and a plurality of rows. At the cassette shelf 105, a transfer shelf 123 is installed to store cassettes 110 that are carrying objects of a wafer transfer mechanism 125.

At the upper side of the cassette stage 114, a standby cassette shelf 107 is installed. The standby cassette shelf 107 is configured to store standby cassettes 110.

Between the cassette stage 114 and the cassette shelf 105, a cassette carrying device 118 is installed. The cassette carrying device 118 includes a cassette elevator 118a capable of moving upward and downward while holding a cassette 110, and a cassette carrying mechanism 118b. The cassette carrying device 118 is configured to carry cassettes 110 among the cassette stage 114, the cassette shelf 105, and the standby cassette shelf 107 by continuous motions of the cassette elevator 118a and the cassette carrying mechanism 118b.

At the backside of the cassette shelf 105, the wafer transfer mechanism 125 is installed. The wafer transfer mechanism 125 includes a wafer transfer device 125a capable of rotating or linearly moving wafers 200 in a horizontal direction, and a wafer transfer device elevator 125b configured to move the wafer transfer device 125a upward and downward. At the wafer transfer device 125a, tweezers 125c are installed to pick up wafers 200. The wafer transfer mechanism 125 is configured such that wafers 200 can be placed on the tweezers 125c to charge the wafers 200 into a boat 217 or discharge the wafers 200 from the boat 217 by continuous motions of the wafer transfer device 125a and the wafer transfer device elevator 125b.

At the upside of the rear part of the case 111, a process furnace 202 is installed to perform a heat treatment process on wafers 200, and the bottom side of the process furnace 202 is configured to be opened and closed by a furnace port shutter 147.

At the downside of the process furnace 202, a boat elevator 115 is installed to move the boat 217 upward to and downward from the process furnace 202. An arm 128 is connected to an elevating table of the boat elevator 115. A seal cap 219 is horizontally installed on the arm 128. The seal cap 219 supports the boat 217 vertically, and is configured to seal the bottom side of the process furnace 202.

The boat 217 includes a plurality of holding members and is configured to hold a plurality of wafers 200 (for example, about fifty to one hundred fifty wafers) horizontally in a state where the wafers 200 are vertically arranged with the centers of the wafers 200 being aligned.

At the upside of the cassette shelf 105, a cleaning unit 134a is installed to supply clean air as a purified atmosphere. The cleaning unit 134a includes a supply fan and a dust filter to supply clean air to the inside of the case 111.

At the left side end part of the case 111, another cleaning unit 134b is installed to supply clean air. The cleaning system 134b includes a supply fan and a dust filter to supply clean air to the surrounding area of the wafer transfer device 125a, the boat 217, and the like. After flowing around the wafer transfer device 125a, the boat 217, and the like, the clean air is exhausted to the outside of the case 111.

<Operation of Substrate Processing Apparatus>

Next, a main operation of the substrate processing apparatus 101 will be described.

A cassette 110 carried to the cassette stage 114 by the in-process carrying device (not shown) is placed on the cassette stage 114 in a state where wafers 200 inside the cassette 110 are vertically positioned and the wafer entrance of the cassette 110 is pointed upward. Thereafter, the cassette 110 is rotated counterclockwise by 90° in a longitudinal direction toward the backward of the case 111 by the cassette stage 114 so that the wafers 200 inside the cassette 110 are horizontally positioned and the wafer hole of the cassette 110 is pointed to the backward of the case 111.

Then, the cassette 110 is automatically carried and placed by the cassette carrying device 118 to a specified shelf position of the cassette shelf 105 or the standby cassette shelf 107 where the 110 is temporarily stored. Thereafter, the cassette 110 is transferred to the transfer shelf 123 from the cassette shelf 105 or the standby cassette shelf 107 by the cassette carrying device 118. Alternatively, the carry cassette 110 may be directly transferred to the transfer shelf 123 from the cassette stage 114.

After the cassette 110 is transferred to the transfer shelf 123, wafers 200 are picked up from the cassette 110 through the wafer entrance of the cassette 110 and are charged into the boat 217 by the tweezers 125c of the wafer transfer device 125a. After delivering the wafer 200 to the boat 217, the wafer transfer device 125a returns to the cassette 110 so as to charge the next wafers 200 into the boat 217.

After a predetermined number of wafers 200 are charged into the boat 217, the bottom side of the process furnace 202 closed by the furnace port shutter 147 is opened by moving the furnace shutter 147. Subsequently, the boat 217 in which a group of wafers 200 is held is loaded into the process furnace 202 by an ascending motion of the boat elevator 115, and the bottom side of the process furnace 202 is closed by the seal cap 219.

After the loading, a predetermined treatment process is performed on the wafers 200 charged in the process furnace 202. Thereafter, the wafers 200 and the cassette 110 are carried to the outside of the case 111 in a reverse sequence of the above.

<Structure of Process Furnace>

Next, with reference to FIG. 2 and FIG. 3, the process furnace 202 of the substrate processing apparatus 101 will be described.

Figure 2:
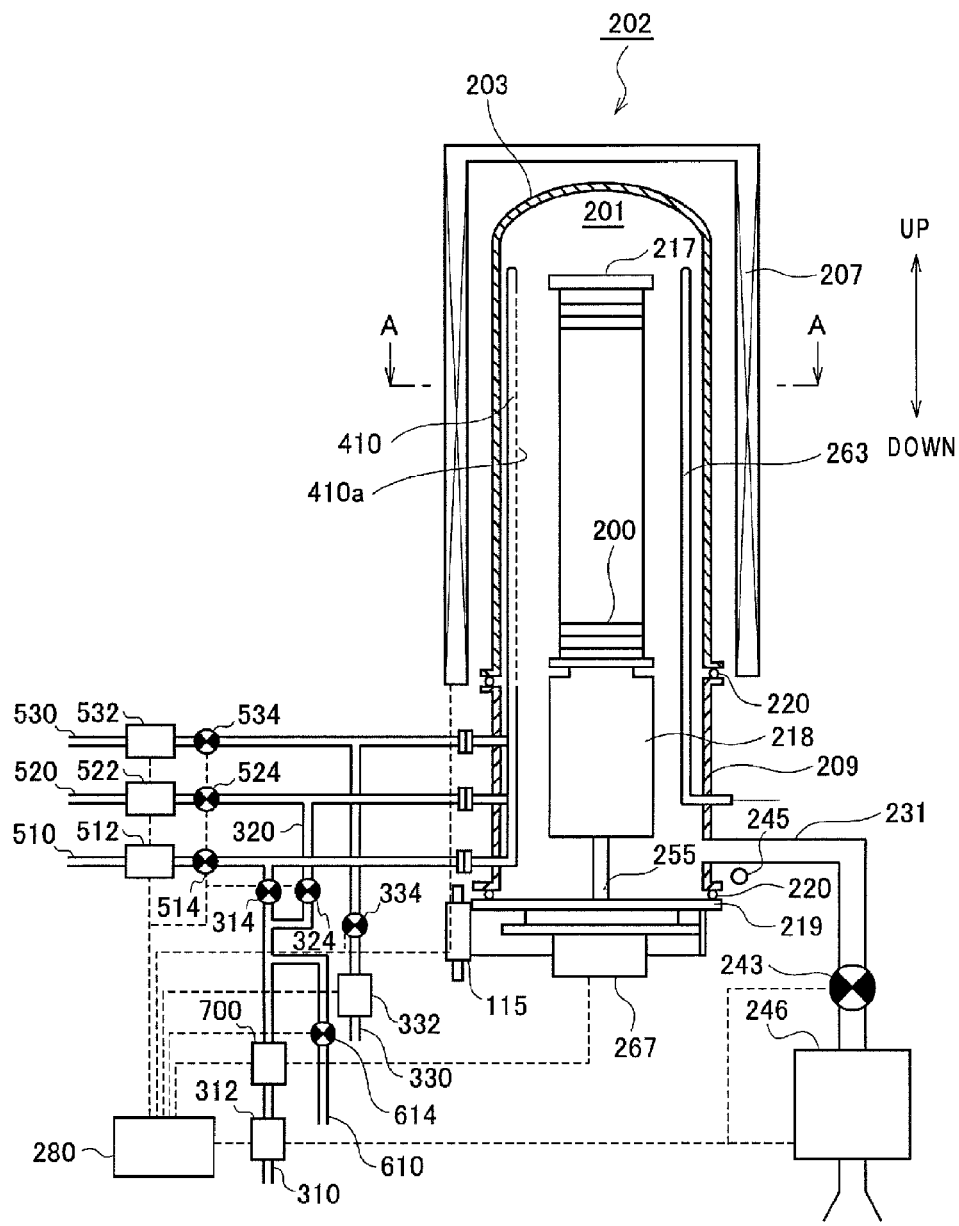
FIG. 2 is a schematic view illustrating a process furnace and surrounding members that can be properly used according to an embodiment of the present invention, in which a vertical section of the process furnace is illustrated.
Figure 3:
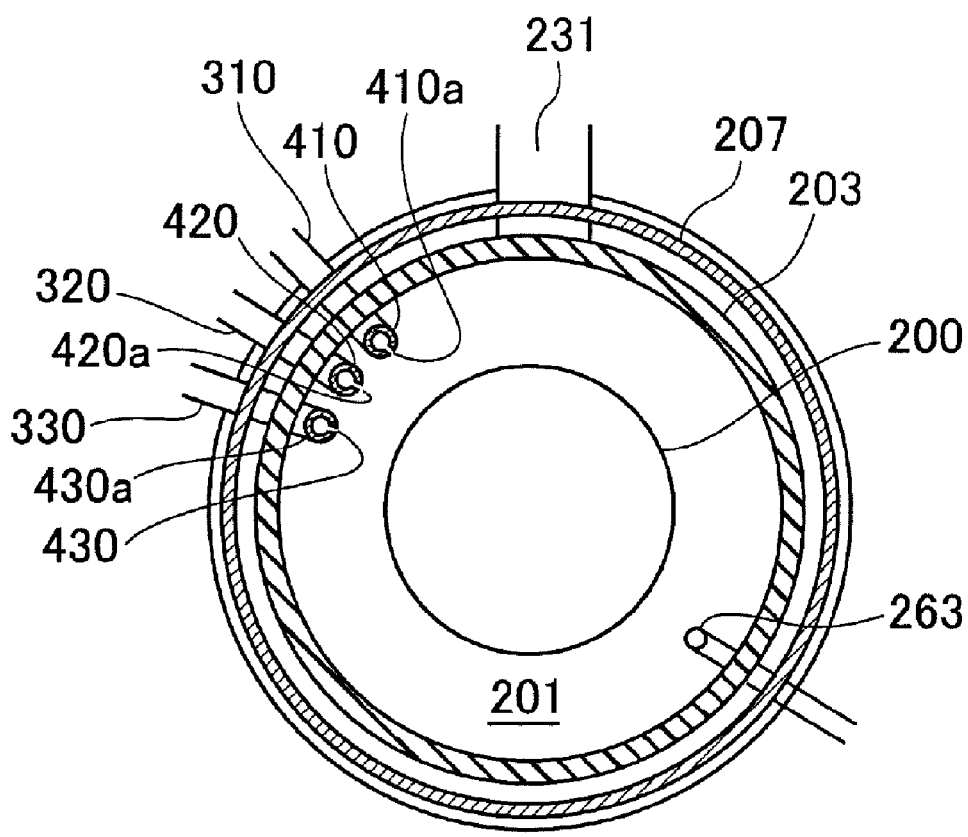
FIG. 3 is a sectional view taken along line A-A of the process furnace of FIG. 2 that can be properly used according to an embodiment of the present invention.

As shown in FIG. 2 and FIG. 3, at the process furnace 202, a heater 207 is installed as a heating device (heating unit) to heat wafers 200. The heater 207 includes an insulating member having a cylindrical shape with a closed top side, and a plurality of heating wires installed with respect to the insulating member to form a heating unit structure. Inside the heater 207, a reaction tube 203 made of quartz is installed to process wafers 200.

At the lower end of the reaction tube 203, a manifold 209 made of a material such as stainless steel is installed in a manner such that an O-ring 220 is disposed therebetween as a sealing member. A bottom opening of the manifold 209 is hermetically closed by a cover such as the seal cap 219 with a sealing member such as an O-ring 220 being disposed therebetween. That is, at the lower side of the reaction tube 203, the seal cap 219 is installed as a furnace port cover capable of hermetically closing a bottom opening of the reaction tube 203. The seal cap 219 is configured to make contact with the bottom side of the reaction tube 203 in a perpendicular direction from the lower side. The seal cap 219 is made of a metal such as stainless steel and has a circular disk shape. On the surface of the seal cap 219, the O-ring 220 is installed as a seal member configured to make contact with the bottom side of the reaction tube 203. At the process furnace 202, a processing chamber 201 is formed by at least the reaction tube 203, the manifold 209, and the seal cap 219.

At a side of the seal cap 219 opposite to the processing chamber 201, a rotary mechanism 267 is installed to rotate the boat 217. A rotation shaft 255 of the rotary mechanism 267 penetrates the seal cap 219 and is connected to the boat 217 (described later) through a boat support 218 that supports the boat 217. By rotating the boat 217 with the rotary mechanism 267, wafers 200 can be rotated. The seal cap 219 is configured to be vertically moved by an elevator such as the boat elevator 115 installed outside the reaction tube 203, so that the boat 217 can be loaded into and unloaded from the processing chamber 201.

As shown in FIG. 1, the boat 217 includes a bottom plate 210 fixed to the boat support 218, a top plate 211 disposed at the top side of the boat 217, and a plurality of pillars 212 installed between the bottom plate 210 and the top plate 211. The boat 217 is configured to hold a plurality of wafers 200. The plurality of wafers 200 are supported by the pillars 212 of the boat 217 in a state where the wafers 200 are arranged at regular intervals and horizontally oriented.

At the above-described process furnace 202, in a state where a plurality of wafers 200 to be batch-processed are piled in multiple states inside the boat 217, the boat 217 is inserted into the processing chamber 201 while being supported by the boat support 218, and then the heater 207 heats the wafers 200 inserted in the processing chamber 201 to a predetermined temperature.

As shown in FIG. 2 and FIG. 3, three gas supply pipes 310, 320, and 330 (a first gas supply pipe 310, a second gas supply pipe 320, and a third gas supply pipe 330) are connected to the processing chamber 201 to supply source gases (reaction gases).

At the gas supply pipe 310, a flow rate control device (flow rate control unit) such as a mass flow controller 312, a vaporizing unit (vaporizing device) such as a vaporizer 700, and an on-off valve such as a valve 314 are installed sequentially from the upstream side of the gas supply pipe 310. The upstream end of a nozzle 410 (first nozzle 410) is connected to the leading end (downstream end) of the gas supply pipe 310. The nozzle 410 has an L-shape constituted by a vertical part and a horizontal part. The vertical part of the nozzle 410 extends in a vertical direction (stacked direction of wafers 200) in the arc-shaped space between the reaction tube 203 constituting the processing chamber 201 and the wafers 200 along the inner wall of the reaction tube 203. The horizontal part of the nozzle 410 is installed such that the horizontal part penetrates the side wall of the manifold 209. A plurality of gas supply holes 410a are formed in the lateral side of the nozzle 410 to supply a source gas through the gas supply holes 410a. The sizes of the gas supply holes 410a are equal or varied from the lower side to the upper side, and the gas supply holes 410a are arranged at the same pitch.

In addition, a vent line 610, which is connected to an exhaust pipe 231 (described later), and a valve 614 are connected to the gas supply pipe 310 at a position between the vaporizer 700 and the valve 314. When a source gas is not supplied into the processing chamber 201, the source gas may be discharged to the vent line 610 through the valve 614 by opening the valve 614 in a state where the valves 314 and 324 are closed.

In addition, the downstream end of a carrier gas supply pipe 510 is connected to the downstream side of the valve 314 of the gas supply pipe 310 to supply an inert gas as a carrier gas. At the carrier gas supply pipe 510, a mass flow controller 512 and a valve 514 are installed sequentially from the upstream side of the carrier gas supply pipe 510.

In addition, the upstream end of the gas supply pipe 320 is connected to the gas supply pipe 310 between the valve 314 and a joint part of the vent line 610. The valve 324 which is an on-off valve is installed at the gas supply pipe 320. The upstream end of a nozzle 420 (second nozzle 420) is connected to the leading end (downstream end) of the gas supply pipe 320. The nozzle 420 has an L-shape constituted by a vertical part and a horizontal part. The vertical part of the nozzle 420 extends in a vertical direction (stacked direction of wafers 200) in the arc-shaped space between the reaction tube 203 constituting the processing chamber 201 and the wafers 200 along the inner wall of the reaction tube 203. The horizontal part of the nozzle 420 is installed such that the horizontal part penetrates the side wall of the manifold 209. A plurality of gas supply holes 420a are formed in the lateral side of the nozzle 420 to supply a source gas through the gas supply holes 420a. The sizes of the gas supply holes 420a are equal or varied from the lower side to the upper side, and the gas supply holes 420a are arranged at the same pitch. In addition, it is preferable that the sizes (diameters) of the gas supply holes 410a are different from the sizes (diameters) of the gas supply holes 420a. For example, the sizes of the gas supply holes 410a are greater than the sizes of the gas supply holes 420a. Furthermore, in FIG. 2, the vaporizer 700 and the mass flow controller 312 are connected to both the nozzles 410 and 420 as a common vaporizing unit and a common mass flow controller. However, separate vaporizing units and mass flow controllers may be connected independently to the nozzles 410 and 420.

In addition, the downstream end of a carrier gas supply pipe 520 is connected to the downstream side of the valve 324 of the gas supply pipe 320 to supply an inert gas as a carrier gas. At the carrier gas supply pipe 520, a mass flow controller 522 and a valve 524 are installed sequentially from the upstream side of the carrier gas supply pipe 520.

At the gas supply pipe 330, a flow rate control device (flow rate control unit) such as a mass flow controller 332, and a valve 334 are installed sequentially from the upstream side of the gas supply pipe 330. The upstream end of a nozzle 430 (third nozzle 430) is connected to the leading end (downstream end) of the gas supply pipe 330. The nozzle 430 has an L-shape constituted by a vertical part and a horizontal part. Like the nozzle 410, the vertical part of the nozzle 430 extends in a vertical direction (stacked direction of wafers 200) in the arc-shaped space between the reaction tube 203 constituting the processing chamber 201 and the wafers 200 along the inner wall of the reaction tube 203. The horizontal part of the nozzle 430 is installed such that the horizontal part penetrates the side wall of the manifold 209. A plurality of gas supply holes 430a are formed in the lateral side of the nozzle 430 to supply a source gas through the gas supply holes 430a. Like the gas supply holes 410a, the sizes of the gas supply holes 430a are equal or varied from the lower side to the upper side, and the gas supply holes 430a are arranged at the same pitch.

In addition, the downstream end of a carrier gas supply pipe 530 is connected to the downstream side of the valve 334 of the gas supply pipe 330 to supply an inert gas as a carrier gas. At the carrier gas supply pipe 530, a mass flow controller 532 and a valve 534 are installed.

For example, if a source supplied from the gas supply pipe 310 is liquid, the liquid source is supplied to the vaporizer 700 while controlling the flow rate of the liquid source by using the mass flow controller 312. A vaporized gas, which is a source gas (reaction gas) generated by vaporizing a liquid source at the vaporizer 700, flows to the downstream side of the gas supply pipe 310 through the valve 314 where the vaporized gas is mixed with a carrier gas supplied from the carrier gas supply pipe 510, and then the gas mixture is supplied into the processing chamber 201 through the nozzle 410. In addition, by controlling the valves 314 and 324, the vaporized gas which is a source gas (reaction gas) can be supplied into the processing chamber 201 either through the gas supply pipe 310 or the gas supply pipe 320 or both through the gas supply pipes 310 and 320. In addition, if a source supplied from the gas supply pipe 310 is gas, the mass flow controller 312 may be replaced with a mass flow controller adapted to control the flow rate of gas, and the vaporizer 700 may be not used.

In addition, a source gas (reaction gas) supplied from the gas supply pipe 330 flows to the downstream side of the gas supply pipe 330 through the valve 334 while the flow rate of the source gas is controlled by the mass flow controller 332, and then the source gas is mixed with a carrier gas supplied from the carrier gas supply pipe 530. Then, the gas mixture is supplied into the processing chamber 201 through the nozzle 430.

In the above-described structure, for example, a source such as a Ti source (e.g., titanium tetrachloride ($TiCl_4$), tetrakis(dimethylamido)titanium (TDMAT, $Ti[N(CH_3)_2]_4$), or tetrakis(diethylamino)titanium (TDEAT, $Ti[N(CH_2CH_3)_2]_4$) is introduced into the gas supply pipe 310. For example, as a modification source, a nitriding source such as ammonia ($NH_3$), nitrogen ($N_2$), nitrous oxide ($N_2O$), monomethylhydrazine ($CH_6N_2$), or hydrogen ($H_2$) is introduced into the gas supply pipe 330.

In the current embodiment, a source supply unit (source supply system) is constituted mainly by the gas supply pipe 310, the mass flow controller 312, the vaporizer 700, the valve 314 (on-off valve), the nozzle 410, the gas supply holes 410a, the gas supply pipe 320, the valve 324, the nozzle 420, the gas supply holes 420a, the gas supply pipe 330, the mass flow controller 332, the valve 334, the nozzle 430, and the gas supply holes 430a. Furthermore, in the current embodiment, an inert gas supply unit (inert gas supply system) is constituted mainly by the carrier gas supply pipe 510, the mass flow controller 512, the valve 514, the carrier gas supply pipe 520, the mass flow controller 522, the valve 524, the carrier gas supply pipe 530, the mass flow controller 532, and the valve 534.

At the reaction tube 203, the exhaust pipe 231 is installed to exhaust the inside atmosphere of the processing chamber 201. A pressure sensor 245 which is a pressure detector (pressure detecting part) configured to detect the inside pressure of the processing chamber 201, an auto pressure controller (APC) valve 243 which is a pressure regulator (pressure regulating part), and a vacuum pump 246 which is a vacuum exhaust device are sequentially installed from the upstream side of the exhaust pipe 231. By operating the vacuum pump 246 and controlling the degree of opening of the APC valve 243 based on pressure information detected by the pressure sensor 245, the inside of the processing chamber 201 can be vacuum-evacuated to a predetermined pressure (vacuum degree).

The APC valve 243 is an on-off valve, which can be opened and closed to start and stop vacuum evacuation of the inside of the processing chamber 201 and can be adjusted in degree of valve opening for pressure adjustment. An exhaust system is constituted mainly by the exhaust pipe 231, the APC valve 243, the vacuum pump 246, and the pressure sensor 245.

At the reaction tube 203, a temperature sensor 263 is installed as a temperature detector. By controlling power supplied to the heater 207 based on temperature information detected by the temperature sensor 263, desired temperature distribution can be obtained in the processing chamber 201. Like the nozzles 410 and 420, the temperature sensor 263 has an L-shape and is disposed along the inner wall of the reaction tube 203.

At the center part inside the reaction tube 203, the boat 217 is installed. As described above, the boat 217 is configured to be loaded into and unloaded from the reaction tube 203 by raising and lowering the seal cap 219 with the boat elevator 115. In addition, as described above, the rotation shaft 255 of the (boat) rotary mechanism 267 is connected to the bottom side of the boat support 218 that supports the boat 217, so as to improve processing uniformity by rotating the boat 217. By operating the boat rotary mechanism 267, the boat 217 supported by the boat support 218 can be rotated.

A controller 280 is connected to the above-described members such as the mass flow controllers 312, 332, 512, 522, and 532, the valves 314, 324, 334, 514, 524, 534, 243, and 614, the heater 207, the vacuum pump 246, the boat rotary mechanism 267, the boat elevator 115, the pressure sensor 245, and the temperature sensor 263. The controller 280 is an example of a control unit (control device) used to control overall operations of the substrate processing apparatus 101. For example, the controller 280 controls operations such as flow rate adjusting operations of the mass flow controllers 312, 332, 512, 522, and 532; opening and closing operations of the valves 314, 324, 334, 514, 524, 534, and 614; opening and closing operations of the valve 243 and a pressure adjusting operation of the valve 243 based on pressure information detected by the pressure sensor 245; a temperature adjusting operation of the heater 207 based on temperature information detected by the temperature sensor 263; start and stop operations of the vacuum pump 246; a rotation speed adjusting operation of the boat rotary mechanism 267; and an elevating operation of the boat elevator 115.

<Method of Manufacturing Semiconductor Device>

Next, an explanation will be given on an exemplary method of forming an insulating film on a substrate by using the process furnace 202 of the substrate processing apparatus 101 in a semiconductor device manufacturing process such as a large scale integration (LSI) circuit manufacturing process. In the following description, the controller 280 controls parts of the substrate processing apparatus 101.

First Embodiment

Figure 4:
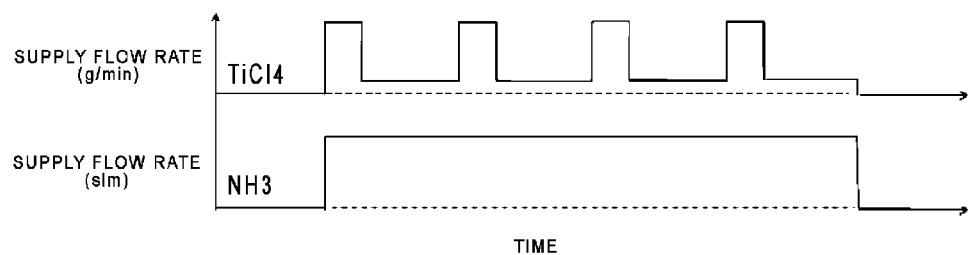
FIG. 4 is a view illustrating a gas supply sequence of a film forming process according to a first embodiment of the present invention.
Figure 10:
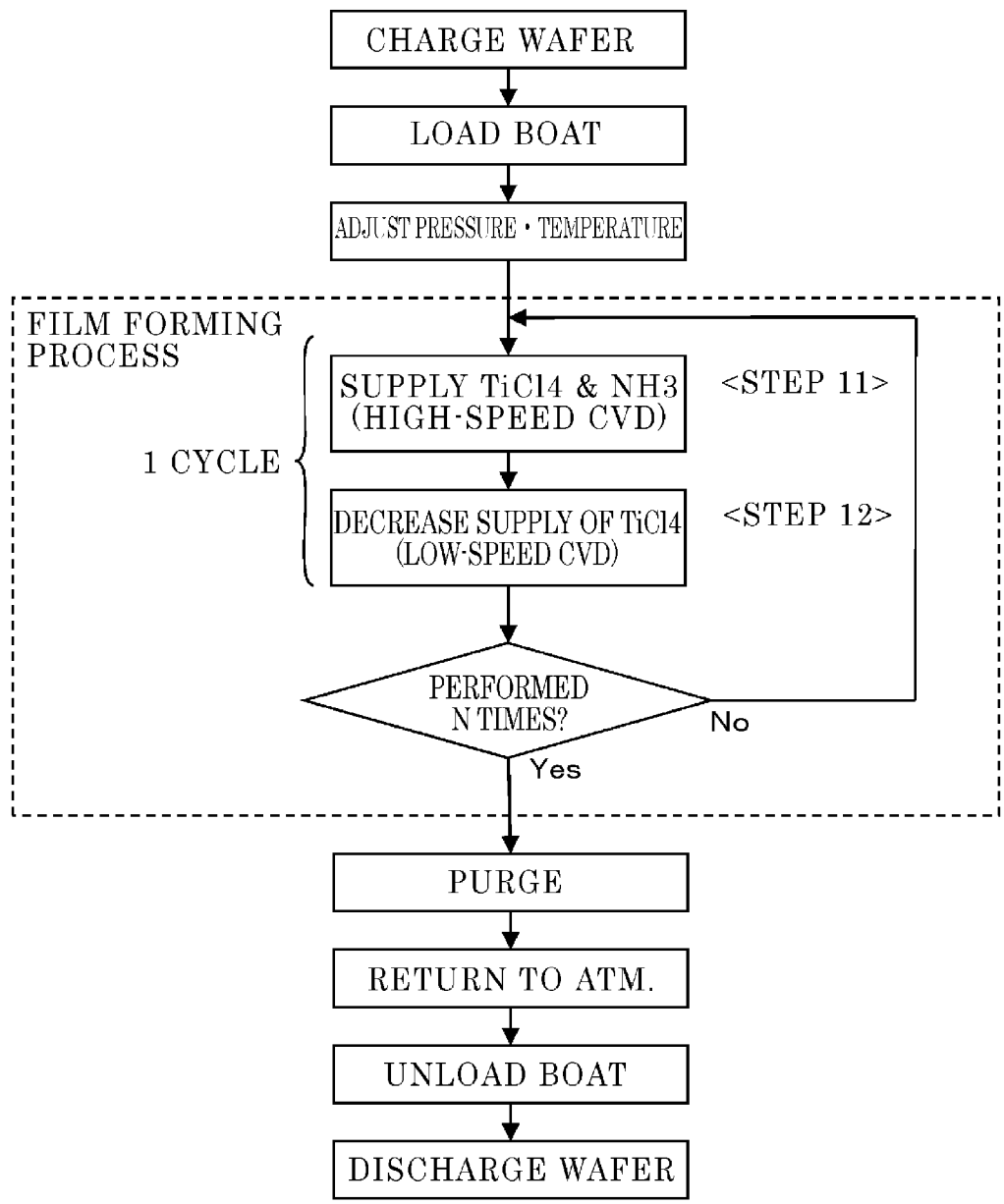
FIG. 10 is a flowchart for explaining a substrate processing process according to the first embodiment of the present invention.

In the current embodiment, an explanation will be given on a method of forming a titanium nitride film on a substrate as a conductive film. FIG. 10 is a flowchart for explaining a substrate processing process as a semiconductor device manufacturing process according to the current embodiment. In addition, FIG. 4 is a view illustrating a gas supply sequence of a film forming process performed in the substrate processing process of the current embodiment.

According to the current embodiment, a titanium nitride film is formed on a substrate by two chemical vapor deposition (CVD) methods at different film growth rates. First, a titanium nitride film is formed on a wafer 200 in a first film forming process by a high-speed CVD method (step 11). Next, a titanium nitride film is formed on the wafer 200 in a second film forming process by a low-speed CVD method which is realized by reducing the flow rate of a titanium-containing source relative to the flow rate of a nitriding gas while supplying the nitriding gas at a sufficient flow rate (step 12). The first and second film forming processes are performed at least once in the same processing chamber 201 to form a titanium nitride layer on the wafer 200. In the current embodiment, an explanation will be on an exemplary case of using $TiCl_4$ as a titanium (Ti)-containing source and $NH_3$ as a nitriding gas. Whether the film growth rate is high or low is determined by the supply amount of $TiCl_4$ which is a source gas. If the supply amount of a source gas is large, the film growth rate is high because the amount of adsorption (or amount of deposition) per unit time increases. On the other hand, if the supply amount of a source gas is small, the film growth rate is low because the amount of adsorption (or amount of deposition) per unit time decreases.

As shown in FIG. 10, first, wafers 200 to be processed are charged into the boat 217 (wafer charging). Next, the boat elevator 115 is lifted to load the boat 217, in which the wafers 200 are charged, into the processing chamber 201 and hermetically close the processing chamber 201 with the seal cap 219 (boat loading). After the wafers 200 are loaded, the rotary mechanism 267 is operated to rotate the wafers 200.

Next, the APC valve 243 is opened in a state where the vacuum pump 246 is operated, so as to exhaust the inside of the processing chamber 201. Subsequently, by controlling the degree of opening of the APC valve 243, the inside pressure of the processing chamber 201 is adjusted to a predetermined level. Thereafter, the heater 207 is controlled to keep the inside of the processing chamber 201 at a temperature where a CVD reaction can occur, for example, in the range from 250° C. to 800° C. Preferably, the inside of the processing chamber 201 may be kept at a temperature lower than 700° C., more preferably, at 450° C. (Pressure and temperature adjustment). If the temperature of the wafers 200 reaches 450° C. and conditions such as a temperature condition are stabilized, the wafers 200 are processed according to a later-described sequence in a state where the inside of the processing chamber 201 is kept at 450° C.

To deposit a titanium nitride film by a CVD method, the controller 280 controls devices such as valves, mass flow controllers, and a vacuum pump to supply $TiCl_4$ and $NH_3$ into the processing chamber 201 according to predetermined timing so that the $TiCl_4$ and the $NH_3$ can exist together and cause a gaseous reaction (CVD reaction). Hereinafter, a film forming sequence will be explained in detail.

$TiCl_4$ is liquid at normal temperature. Thus, $TiCl_4$ may be supplied into the processing chamber 201 after vaporizing the $TiCl_4$ by heating the $TiCl_4$ or after vaporizing the $TiCl_4$ using the vaporizer 700. That is, in the latter case, inert gas such as helium (He), neon (Ne), argon (Ar), or nitrogen ($N_2$) may be supplied as a carrier gas so that it passes through a $TiCl_4$ container of the vaporizer 700, and then vaporized $TiCl_4$ may be supplied into the processing chamber 201 together with the carrier gas. In the following description, the latter case will be explained as an example.

In the first film forming process (step 11) and the second film forming process (step 12) of the sequence, $TiCl_4$ and $NH_3$ are simultaneously supplied.

To supply $TiCl_4$ into the processing chamber 201, $TiCl_4$ is supplied into the gas supply pipe 310 and/or the gas supply pipe 320 (that is, $TiCl_4$ is supplied into either the gas supply pipe 310 or the gas supply pipe 320 or both the gas supply pipes 310 and 320), and a carrier gas is supply into the carrier gas supply pipe 510 and the carrier gas supply pipe 520. Then, the valve 314 of the gas supply pipe 310 and/or the valve 324 of the gas supply pipe 320, the valve 514 of the carrier gas supply pipe 510, the valve 524 of the carrier gas supply pipe 520, and the valve 243 of the exhaust pipe 231. Carrier gas flows through the carrier gas supply pipe 510 and the carrier gas supply pipe 520, and the flow rates of the carrier gas are controlled by the mass flow controllers 512 and 522. $TiCl_4$ flows through the gas supply pipe 310 where the flow rate of the $TiCl_4$ is controlled by the mass flow controller 312 and the $TiCl_4$ is vaporized by the vaporizer 700, and then the $TiCl_4$ is mixed with the carrier gas the flow rate of which is controlled. Then, the mixture is supplied into the processing chamber 201 through the gas supply holes 410a of the nozzle 410. $TiCl_4$ directed to the gas supply pipe 320 is supplied into the processing chamber 201 through the gas supply holes 420a of the nozzle 420.

The sizes of the gas supply holes 410a of the nozzle 410 may be greater than the sizes of the gas supply holes 420a of the nozzle 420. In this case, since the sizes of the gas supply holes 410a are greater than the sizes of the gas supply holes 420a, in step 11 for forming a titanium nitride film by a high-speed CVD method, it may be preferable that $TiCl_4$ is supplied into the processing chamber 201 from the gas supply pipe 310 and the gas supply holes 410a of the nozzle 410 at a high flow rate, and in step 12 for forming a titanium nitride film by a low-speed CVD method, it may be preferable that $TiCl_4$ is supplied into the processing chamber 201 from the gas supply pipe 320 and the gas supply holes 420a of the nozzle 420 at a low flow rate.

In addition, $NH_3$ is supplied into the processing chamber 201 by supplying $NH_3$ to the gas supply pipe 330 and a carrier gas ($N_2$) to the carrier gas supply pipe 530. The valve 334 of the gas supply pipe 330, the valve 534 of the carrier gas supply pipe 530, and the valve 243 of the exhaust pipe 231 are opened together. The carrier gas flows in the carrier gas supply pipe 530, and the flow rate of the carrier gas is controlled by the mass flow controller 532. The $NH_3$ flows in the gas supply pipe 330, and the flow rate of the $NH_3$ is controlled by the mass flow controller 332. Then the $NH_3$ is mixed with the carrier gas the flow rate of which is controlled, and the mixture is supplied into the processing chamber 201 through the gas supply holes 430a of the nozzle 430.

Then, the $TiCl_4$ and $NH_3$ supplied into the processing chamber 201 are exhausted through the exhaust pipe 231. At this time, the degree of opening of the valve 243 is properly controlled so as to keep the inside pressure of the processing chamber 201 in the range from 5 Pa to 50 Pa, for example, at 20 Pa. The supply flow rate of $TiCl_4$ is controlled by the mass flow controller 312 in the range from 0.8 g/min to 3.0 g/min when the $TiCl_4$ is supplied through the gas supply pipe 310 and in the range from 0.05 g/min to 0.3 g/min when the $TiCl_4$ is supplied through the gas supply pipe 320. The supply flow rate of $NH_3$ is controlled by the mass flow controller 332 to the range from 0.3 slm to 15 slm. The wafers 200 are exposed to the $TiCl_4$ and $NH_3$ until films are formed on the wafers 200 to a desired thickness. At this time, the temperature of the heater 207 is set such that the temperature of the wafers 200 can be kept in the range from 250° C. to 800° C., for example, at 450° C. If the temperature of the wafers 200 is lower than, for example, 250° C., the rate of reaction between the $TiCl_4$ and $NH_3$ is low, and thus it is difficult to obtain a desired film thickness within a predetermined time for industrially practical use. Therefore, to cause a sufficient high-speed CVD reaction, it may be preferable that the temperature of the wafers 200 is kept in the range from 300° C. to 500° C.

Hereinafter, the first film forming process (step 11) and the second film forming process (step 12) will be explained in detail with reference to FIG. 10 and FIG. 4.

(Step 11)

In the first film forming process (step 11), $TiCl_4$ and $NH_3$ are simultaneously supplied to form titanium nitride films on the wafers 200 by a high-speed CVD method. For example, $TiCl_4$ is supplied to the gas supply pipe 310, $NH_3$ is supplied to the gas supply pipe 330, and a carrier gas is supplied to the carrier gas supply pipe 510 and the carrier gas supply pipe 530. That is, the valves 314 and 334 of the gas supply pipes 310 and 330, the valves 514 and 534 of the carrier gas supply pipes 510 and 530, and the valve 243 of the exhaust pipe 231 are opened together, and the valve 324 of the gas supply pipe 320 is closed. The carrier gas flows in the carrier gas supply pipes 510 and 530, and the flow rates of the carrier gas are controlled by the mass flow controllers 512 and 532.

The $TiCl_4$ flows in the gas supply pipe 310 where the flow rate of the TiCl4 is controlled by the mass flow controller 312 and the $TiCl_4$ is vaporized by the vaporizer 700, and then the $TiCl_4$ is mixed with the carrier gas the flow rate of which is controlled. Then, while the mixture is supplied into the processing chamber 201 through the gas supply holes 410a of the nozzle 410, the mixture is exhausted through the exhaust pipe 231. The $NH_3$ flows in the gas supply pipe 330 where the flow rage of the $NH_3$ is controlled by the mass flow controller 332, and then the $NH_3$ is mixed with the carrier gas the flow rate of which is controlled. Then, while the mixture is supplied into the processing chamber 201 through the gas supply holes 430a of the nozzle 430, the mixture is exhausted through the exhaust pipe 231.

At this time, the degree of opening of the valve 243 is properly controlled so as to keep the inside pressure of the processing chamber 201 in the range from 20 Pa to 50 Pa, for example, at 30 Pa. The supply flow rate of the $TiCl_4$ is controlled by the mass flow controller 312, for example, in the range from 0.8 g/min to 1.5 g/min. The supply flow rate of $NH_3$ is controlled by the mass flow controller 332, for example, in the range from 5.0 slm to 8.0 slm. The wafers 200 are exposed to the $TiCl_4$ and $NH_3$, for example, for 5 seconds to 30 seconds.

At this time, gases flowing in the processing chamber 201 are $TiCl_4$, $NH_3$, and inert gas such as $N_2$. Therefore, owing to a gaseous reaction (thermal CVD reaction) between the $TiCl_4$ and $NH_3$, titanium nitride layers are deposited on the surfaces or under-layer films of the wafers 200. Herein, the term "titanium nitride layer" is used to denote a layer (film) made of titanium nitride, such as a continuous layer, a discontinuous layer, a thin film in which discontinuous layers are superimposed, and a thin film to which another element is added. In addition, a continuous layer made of titanium nitride may also be called "a titanium nitride thin film."

At the same time, the valve 524 is opened to supply inert gas through the carrier gas supply pipe 520 which is connected to the gas supply pipe 320. By this, gases such as the $TiCl_4$ and $NH_3$ can be prevented from flowing to the gas supply pipe 320 from the processing chamber 201.

(Step 12)

In the second film forming process (step 12), the supply flow rate of $NH_3$ is not changed but the supply flow rate of $TiCl_4$ is decreased to form titanium nitride films on the wafers 200 by a low-speed CVD method. The supply flow rate of $TiCl_4$ is decreased by supplying $TiCl_4$ not through the gas supply pipe 310 but only through the gas supply pipe 320 (in the case where the sizes of the gas supply holes 410a of the nozzle 410 are greater than the sizes of the gas supply holes 420a of the nozzle 420). That is, the valve 314 of the gas supply pipe 310 is closed, and the valve 324 of the gas supply pipe 320 is opened. Alternatively, the supply flow rate of $TiCl_4$ may be decreased by another method: in step 11, the valves 314 and 324 are opened to supply $TiCl_4$ through both the gas supply pipes 310 and 320, and in step 12, one of the valves 314 and 324 is closed. In addition, alternatively, the supply flow rate of $TiCl_4$ to the vaporizer 700 (the amount of vaporized gas) may be temporarily decreased by controlling the mass flow controller 312. In addition, alternatively, a mass flow controller (not shown) may be installed between the downstream side of the vaporizer 700 of the gas supply pipe 310 and the upstream side of a joint position of the gas supply pipe 320 in order to decrease the supply flow rate of $TiCl_4$.

The $TiCl_4$ flows in the gas supply pipe 320 and is mixed with a carrier gas the flow rate of which is controlled, and while the mixture is supplied into the processing chamber 201 through the gas supply holes 420a of the nozzle 420, the mixture is exhausted through the exhaust pipe 231. The $TiCl_4$ is supplied into the processing chamber 201 in a supply flow rate range where a low-speed CVD reaction can occur, for example, in the range from 0.05 g/min to 0.3 g/min. The wafers 200 are exposed to the $TiCl_4$ and $NH_3$, for example, for 15 seconds to 120 seconds. Titanium nitride films formed at this time have a small amount of residue Cl and low-resistance, dense, continuous features as compared with the titanium nitride films formed by the high-speed CVD method. In addition, as compared with the amount of film formation, sufficiently excessive $NH_3$ permeates into films so that the amount of Cl included in the inner high-speed CVD films can be reduced.

At the same time, in a state where the valve 514 is kept opened, inert gas is supplied through the carrier gas supply pipe 510 connected to the gas supply pipe 310. By this, gases such as the $TiCl_4$ and $NH_3$ can be prevented from flowing to the gas supply pipe 310 from the processing chamber 201.

The above-described step 11 and step 12 are set as one cycle, and the cycle is performed at least once to form titanium nitride films on the wafers 200 to a predetermined thickness by two different CVD methods.

After the film forming process is performed to a titanium nitride to a predetermined thickness, in a state where the valves 514, 524, and 534 are opened, the valves 314, 324, and 334 are closed to supply inert gas such as $N_2$ gas into the processing chamber 201 and exhaust the inert gas from the processing chamber 201 so as to purge the inside of the processing chamber 201 with the inert gas (purge). If the inside atmosphere of the processing chamber 201 is replaced with the inert gas (replacement with inert gas), the degree of opening of the APC valve 243 is adjusted so that the inside pressure of the processing chamber 201 can return to normal pressure (return to atmospheric pressure). Thereafter, the seal cap 219 is lowered by the boat elevator 115 to open the bottom side of the reaction tube 203 and unload the boat 217 in which the processed wafers 200 are held to the outside of the reaction tube 203 through the bottom side of the reaction tube 203 (boat unloading). Thereafter, the processed wafers 200 are discharged from the boat 217 (wafer discharging).

In a CVD method, the thickness of a titanium nitride film is controlled by the supply time of gas. As the supply time of gas is increased, a thicker film can be formed, and as the supply time of gas is decreased, a thinner film can be formed. At this time, it is controlled that the thickness of the titanium nitride film formed by the high-speed CVD method in step 11 is equal to or greater than half the total thickness of the titanium nitride film. The reason for this is as follows. If the thickness of the titanium nitride film formed by the low-speed CVD method is relatively great, the film forming time increases. That is, if the film thickness by the low-speed CVD is great, the film forming time increases to consequently lower the effects of relatively high speed and high quality.

According to the current embodiment, in step 12, $NH_3$ is excessively supplied as compared with $TiCl_4$ to attain effects such as removal of Cl from titanium nitride films and improve the film quality. It may be preferable that the supply flow rate of $NH_3$ is higher than that of $TiCl_4$.

Furthermore, in the case where film formation is repeated while varying the supply ratio of $NH_3$ to $TiCl_4$, since the quality of titanium nitride films formed during a low pulse of the supply ratio (step 11) is improved by an excessive amount of $NH_3$ supplied during a high pulse of the supply ratio (step 12), the overall film quality can be uniformly maintained (with less unevenness) by controlling the supply flow rates of gases.

In addition, according to the current embodiment, two or more kinds of sources, for example, $TiCl_4$ and $NH_3$, are simultaneously supplied into the processing chamber 201. The sentence ⌈ two or more kinds of sources are simultaneously supplied into the processing chamber 201 ⌋ means that two or more kinds of sources are supplied into the processing chamber 201 in a mixed state so that the sources can react with each other (chemical vapor reaction) in the processing chamber 201 or on the surfaces of substrates. As long as chemical vapor reaction can occur in the processing chamber 201 or on the surfaces of substrates, the opening and closing timings of the source supply system may be misaligned.

Second Embodiment

Figure 5:
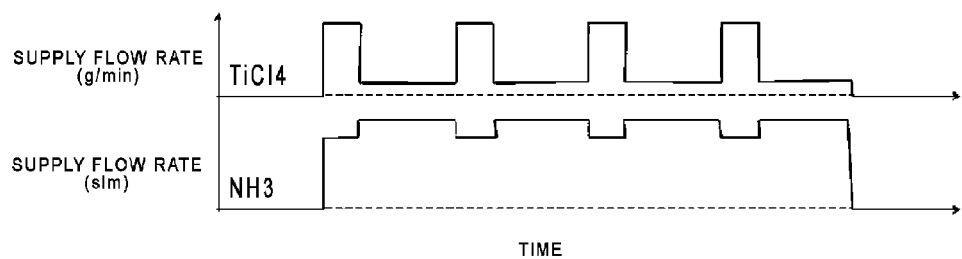
FIG. 5 is a view illustrating a gas supply sequence of a film forming process according to a second embodiment of the present invention.
Figure 11:
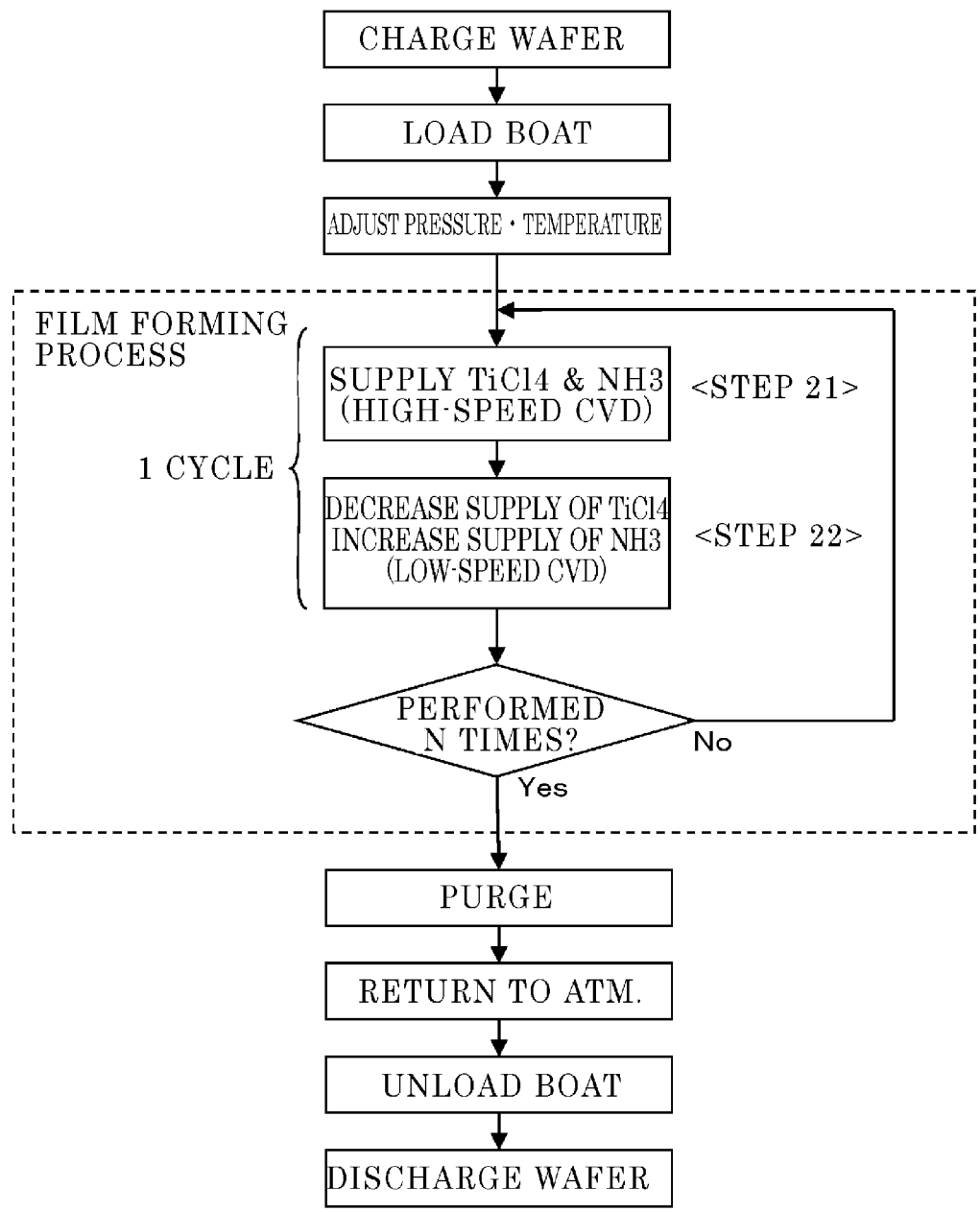
FIG. 11 is a flowchart for explaining a substrate processing process according to the second embodiment of the present invention.

In the description of the current embodiment, an explanation will be given on the different with the first embodiment. FIG. 11 is a flowchart for explaining a substrate processing process as a semiconductor device manufacturing process according to the current embodiment. In addition, FIG. 5 is a view illustrating a gas supply sequence of a film forming process performed in the substrate processing process of the current embodiment.

In the film forming process of the first embodiment, a low-speed CVD method is used in the second film forming process (step 12) in a way of not changing the supply flow rate of $NH_3$ but reducing the supply flow rate of $TiCl_4$. However, in a film forming process of the current embodiment, a low-speed CVD method is executed in a second film forming process (step 22) in a way of reducing the supply flow rate of $TiCl_4$ but increasing the supply flow rate of $NH_3$.

(Step 21)

In a first film forming process (step 21) of the current embodiment, to form titanium nitride films on wafers 200 by using a high-speed CVD method, $TiCl_4$ and $NH_3$ are simultaneously supplied under the same conditions as those used in step 11 of the previous embodiment.

(Step 22)

In the second film forming process (step 22) of the current embodiment, to form titanium nitride films on the wafers 200 by a low-speed CVD method, the supply flow rate of $TiCl_4$ is decreased, and simultaneously the supply flow rate of $NH_3$ is increased. The supply flow rate of $TiCl_4$ is decreased, for example, by supplying $TiCl_4$ not through the gas supply pipe 310 but through the gas supply pipe 320. That is, the valve 314 of the gas supply pipe 310 is closed, and the valve 324 of the gas supply pipe 320 is opened. The $TiCl_4$ flows in the gas supply pipe 320 and is mixed with a carrier gas the flow rate of which is controlled, and while the mixture is supplied into the processing chamber 201 through the gas supply holes 420a of the nozzle 420, the mixture is exhausted through the exhaust pipe 231. The $TiCl_4$ is supplied into the processing chamber 201 in a supply flow rate range where a low-speed CVD reaction can occur, for example, in the range from 0.05 g/min to 0.3 g/min.

Besides, in step 22, the supply flow rate of $NH_3$ is controlled by the mass flow controller 332 to increase the supply flow rate of $NH_3$, for example, in the range from 6.0 slm to 15 slm. The wafers 200 are exposed to the $TiCl_4$ and $NH_3$, for example, for 15 seconds to 120 seconds. Titanium nitride films formed at this time have a small amount of residue Cl and low-resistance, dense, continuous features as compared with the titanium nitride films formed by the high-speed CVD method. In addition, as compared with the amount of film formation, sufficiently excessive $NH_3$ permeates into films so that the amount of Cl included in the inner high-speed CVD films can be reduced.

At the same time, in a state where the valve 514 is kept opened, inert gas is supplied through the carrier gas supply pipe 510 connected to the gas supply pipe 310. By this, gases such as the $TiCl_4$ and $NH_3$ can be prevented from flowing to the gas supply pipe 310 from the processing chamber 201.

The above-described step 21 and step 22 are set as one cycle, and the cycle is performed at least once to form titanium nitride films on the wafers 200 to a predetermined thickness by two different CVD methods.

In a CVD method, the thickness of a titanium nitride film is controlled by the supply time of gas. As the supply time of gas is increased, a thicker film can be formed, and as the supply time of gas is decreased, a thinner film can be formed. At this time, it is controlled that the thickness of the titanium nitride film formed by the high-speed CVD method in step 21 is equal to or greater than half the total thickness of the titanium nitride film. The reason for this is as follows. If the thickness of the titanium nitride film formed by the low-speed CVD method is relatively great, the film forming time increases. That is, if the film thickness by the low-speed CVD is great, the film forming time increases to consequently lower the effects of relatively high speed and high quality.

According to the current embodiment, in step 22, $NH_3$ is more excessively supplied as compared with $TiCl_4$, so that effects such as removal of Cl from titanium nitride films can be attained and the film quality can be further improved. It may be preferable that the supply rate of $NH_3$ is higher than the supply flow rate of $TiCl_4$. Furthermore, in the case where film formation is repeated while varying the supply ratio of $NH_3$ to $TiCl_4$, since the quality of titanium nitride films formed during a low pulse of the supply ratio (step 21) is improved by an excessive amount of $NH_3$ supplied during a high pulse of the supply ratio (step 22), the overall film quality can be uniformly maintained (with less unevenness) by controlling the supply flow rates of gases.

That is, in the current embodiment, by increasing the supply flow rate of $NH_3$ in step 22, the amount of residue Cl included in the titanium nitride films formed in step 22 can be further reduced, and since excessive $NH_3$ permeates the under-laying titanium nitride films formed in step 21, the amount of residue Cl of the films can be further reduced. At this time, if the supply flow rate of $NH_3$ is higher, larger effects may be attained.

Furthermore, in step 21, $TiCl_4$ and $NH_3$ may be simultaneously supplied under conditions different from those of the step 11.

Third Embodiment

Figure 6:
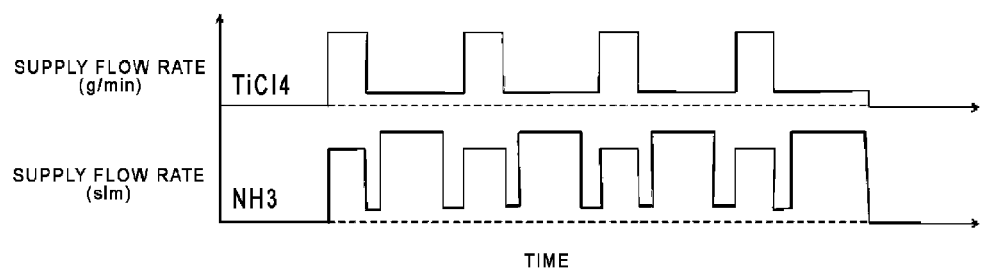
FIG. 6 is a view illustrating a gas supply sequence of a film forming process according to a third embodiment of the present invention.
Figure 12:
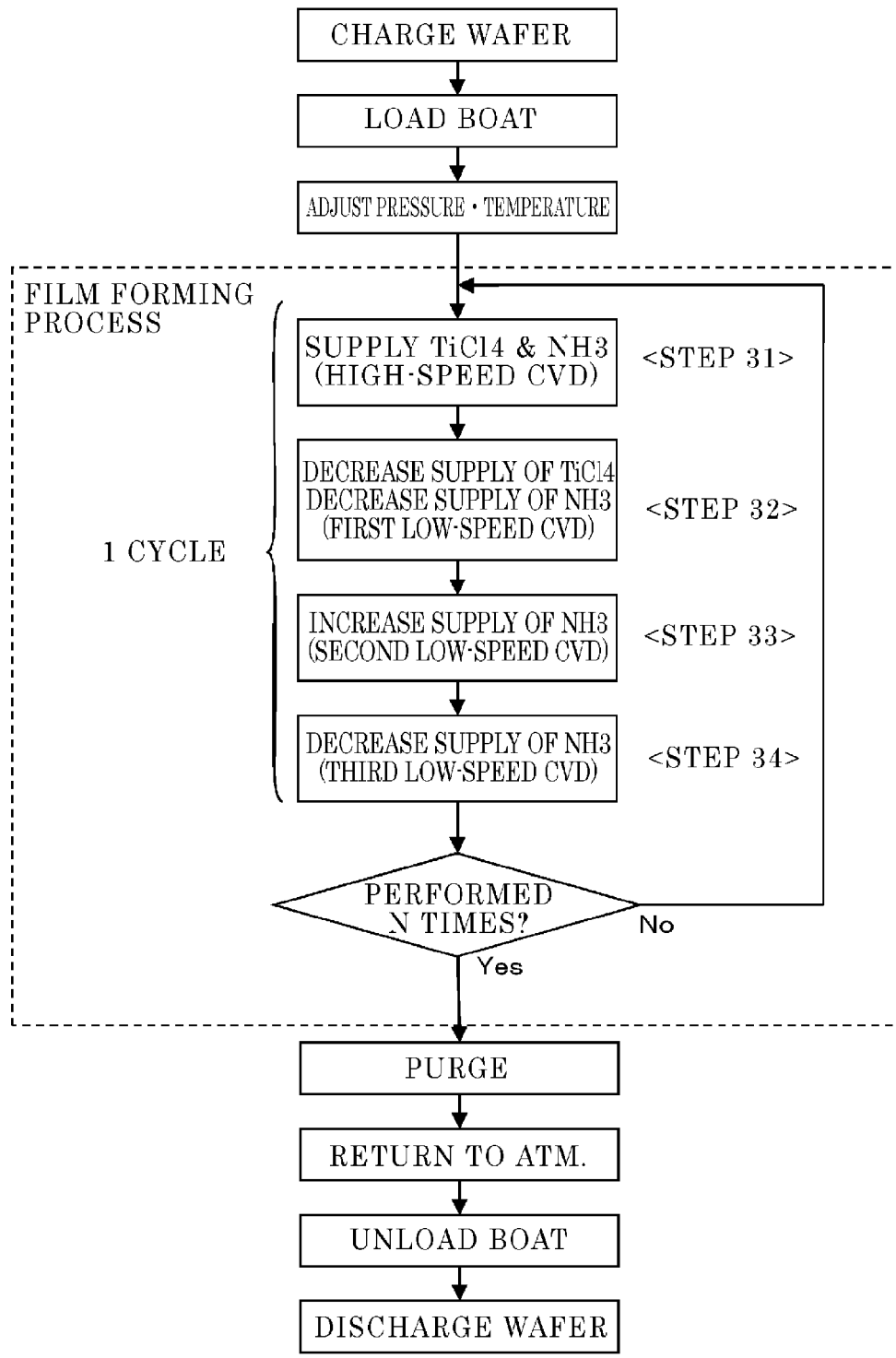
FIG. 12 is a flowchart for explaining a substrate processing process according to the third embodiment of the present invention.

In the description of the current embodiment, an explanation will be given on the different with the second embodiment. FIG. 12 is a flowchart for explaining a substrate processing process as a semiconductor device manufacturing process according to the current embodiment. In addition, FIG. 6 is a view illustrating a gas supply sequence of a film forming process performed in the substrate processing process of the current embodiment.

In the film forming process of the second embodiment, a low-speed CVD method is used in the second film forming process (step 22) in a way of decreasing the supply flow rate of $TiCl_4$ but increasing the supply flow rate of $NH_3$. However, in a film forming process of the current embodiment, the supply flow rate of $TiCl_4$ is reduced and the supply flow rate of $NH_3$ is reduced for a predetermined time in a second film forming process (step 32); in a state where the supply flow rate of $TiCl_4$ is kept at the reduced level, only the supply flow rate of $NH_3$ is increased for a predetermined time in a third film forming process (step 33); and in a state where the supply flow rate of $TiCl_4$ is kept at the reduced level, the supply flow rate of $NH_3$ is reduced again for a predetermined in a fourth film forming process (step 34), so as to execute a low-speed CVD method.

(Step 31)

In a first film forming process (step 31) of the current embodiment, to form titanium nitride films on wafers 200 by using a high-speed CVD method, $TiCl_4$ and $NH_3$ are simultaneously supplied under the same conditions as those used in step 11 and step 21 of the previous embodiments.

(Step 32)

In the second film forming process (step 32) of the current embodiment, to form titanium nitride films on the wafers 200 by a first low-speed CVD method, the supply flow rate of $TiCl_4$ is decreased, and simultaneously the supply flow rate of $NH_3$ is also decreased. The supply flow rate of TiCl4 is decreased, for example, by supplying $TiCl_4$ not through the gas supply pipe 310 but through the gas supply pipe 320. That is, the valve 314 of the gas supply pipe 310 is closed, and the valve 324 of the gas supply pipe 320 is opened. The $TiCl_4$ flows in the gas supply pipe 320 and is mixed with a carrier gas the flow rate of which is controlled, and while the mixture is supplied into the processing chamber 201 through the gas supply holes 420a of the nozzle 420, the mixture is exhausted through the exhaust pipe 231. The $TiCl_4$ is supplied into the processing chamber 201 in a supply flow rate range where a low-speed CVD reaction can occur, for example, in the range from 0.05 g/min to 0.3 g/min.

At the same time, the supply flow rate of $NH_3$ is controlled by the mass flow controller 332 so as to reduce the supply flow rate of $NH_3$, for example, in the range from 0.3 slm to 1.6 slm. In this way, in step 32, the supply flow rates of TiCl$_4$ and NH$_3$ are reduced while maintaining the supply ratio of TiCl$_4$/NH$_3$ similar to the supply ratio of TiCl$_4$/NH$_3$ in step 31. By reducing the introducing amounts of TiCl$_4$ and NH$_3$ which are reactive gases, reaction products can be efficiently discharged to the outside of the processing chamber 201. This may produce effects such as reduction of residue Cl and reduction of contaminants. The wafers 200 are exposed to the TiCl$_4$ and NH$_3$, for example, for 5 seconds to 30 seconds.

At this time, since the supply flow rate of TiCl$_4$ is similar to that in a low-speed CVD method, the growth rate of titanium nitride films may be similar to the growth rate of titanium nitride films by a low-speed CVD method, and since the supply ratio of TiCl$_4$/NH$_3$ is similar to that in a high-speed CVD method, the quality of the titanium nitride films may be similar to the film quality in a high-speed CVD method. However, the film quality may be improved as much as the film growth rate decreases. The film quality may have a medium quality between those of a titanium nitride formed by a high-speed CVD method and a titanium nitride formed by a low-speed CVD method.

At the same time, in a state where the valve 514 is kept opened, inert gas is supplied through the carrier gas supply pipe 510 connected to the gas supply pipe 310. By this, gases such as the TiCl$_4$ and NH$_3$ can be prevented from flowing to the gas supply pipe 310 from the processing chamber 201.

(Step 33)

In the third film forming process (step 33) of the current embodiment, to form titanium nitride films on the wafers 200 by a second low-speed CVD method, the supply flow rate of TiCl$_4$ is not changed (from the reduced level) but the supply flow rate of NH$_3$ is increased for a predetermined time. That is, the supply flow rate of NH$_3$ is controlled by the mass flow controller 332 to increase the supply flow rate of NH$_3$, for example, to the range from 5 slm to 15 slm in consideration of the first embodiment and the second embodiment. The wafers 200 are exposed to the TiCl$_4$ and NH$_3$, for example, for 15 seconds to 120 seconds.

At this time, the titanium nitride films formed in step 33 can have a low residue Cl concentration, and since excessive NH$_3$ permeates the under-laying titanium nitride films formed in step 31 and step 32, the amount of reside Cl of the under-laying titanium nitride films can also be reduced.

(Step 34)

In the fourth film forming process (step 34) of the current embodiment, to form titanium nitride films on the wafers 200 by a third low-speed CVD method, the supply flow rate of TiCl$_4$ is not changed (from the reduced level) but the supply flow rate of NH$_3$ is reduced again for a predetermined time. That is, the supply flow rate of NH$_3$ is controlled by the mass flow controller 332 to decrease the supply flow rate of NH$_3$, for example, to the range from 0.3 slm to 5.0 slm. The wafers 200 are exposed to the TiCl$_4$ and NH$_3$, for example, for 5 seconds to 30 seconds. At this time, since the supply flow rate of TiCl$_4$ is similar to that in a low-speed CVD method, the growth rate of titanium nitride films may be similar to the growth rate of titanium nitride films by a low-speed CVD method. Since the supply ratio of TiCl$_4$/NH$_3$ is intermediate between that in a high-speed CVD method and that in a low-speed CVD method, the quality of the titanium nitride films may be intermediate between the quality of titanium nitride films formed by a high-speed CVD method and the quality of titanium nitride films formed by a low-speed CVD method.

The above-described step 31 to step 34 are set as one cycle, and the cycle is performed at least once to form titanium nitride films on the wafers 200 to a predetermined thickness by a plurality of different CVD methods.

In a CVD method, the thickness of a titanium nitride film is controlled by the supply time of gas. As the supply time of gas is increased, a thicker film can be formed, and as the supply time of gas is decreased, a thinner film can be formed. At this time, the thickness ratio of the titanium nitride film formed by the high-speed CVD method in step 31 and the titanium nitride films formed by the first to third low-speed CVD methods in step 32 to step 34 is controlled such that the thickness of the titanium nitride film formed by the high-speed CVD method is equal to or greater than half the total thickness of the titanium nitride films. The reason for this is as follows. If the thickness of the titanium nitride film formed by the low-speed CVD method is relatively great, the film forming time increases. That is, if the film thickness by the low-speed CVD is great, the film forming time increases to consequently lower the effects of relatively high speed and high quality.

According to the current embodiment, in step 33, NH$_3$ is excessively supplied as compared with TiCl$_4$ to attain effects such as removal of Cl from titanium nitride films and improve the film quality. It may be preferable that the supply rate of NH$_3$ is higher than the supply flow rate of TiCl$_4$. Furthermore, in the case where film formation is repeated while varying the supply ratio of NH$_3$ to TiCl$_4$, since the quality of titanium nitride films formed during a low pulse of the supply ratio (step 31, step 32, or step 34) is improved by an excessive amount of NH$_3$ supplied during a high pulse of the supply ratio (step 33), the overall film quality can be uniformly maintained (with less unevenness) by controlling the supply flow rates of gases.

In addition, according to the current embodiment, since the supply flow rate of NH$_3$ is reduced in step 32 and step 34, reaction products can be easily discharged from the processing chamber 201, and since the supply flow rate of NH$_3$ is increased in step 33, Cl can be removed to improve the quality of titanium nitride films.

Furthermore, in step 31, TiCl$_4$ and NH$_3$ may be simultaneously supplied under conditions different from those of the step 11.

Fourth Embodiment

Figure 7:
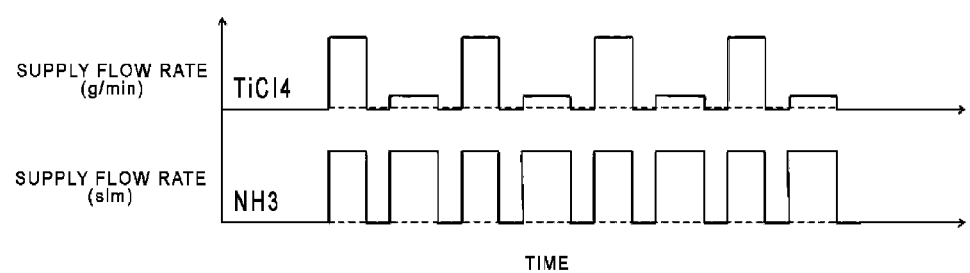
FIG. 7 is a view illustrating a gas supply sequence of a film forming process according to a fourth embodiment of the present invention.
Figure 13:
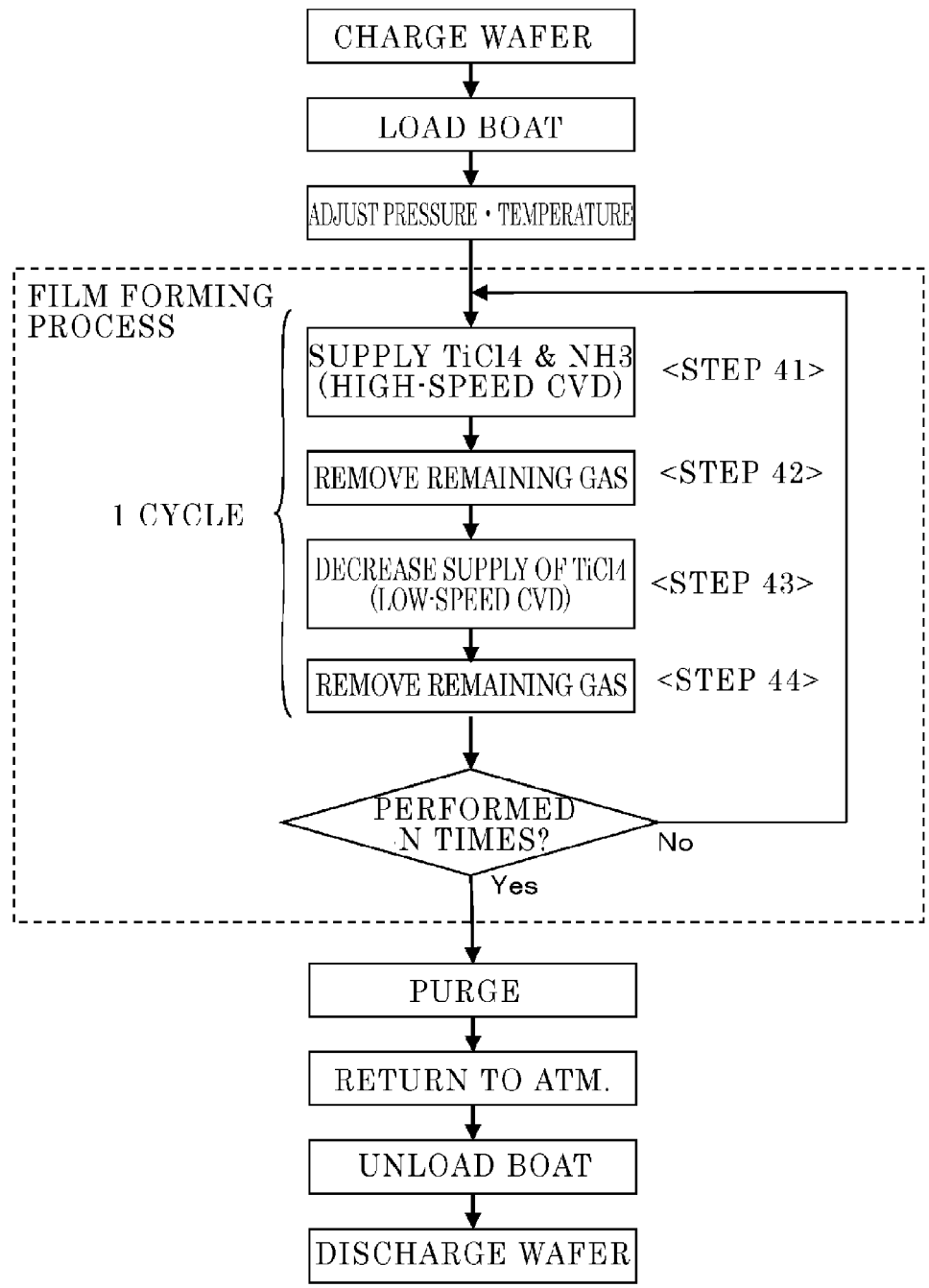
FIG. 13 is a flowchart for explaining a substrate processing process according to the fourth embodiment of the present invention.

In the description of the current embodiment, an explanation will be given on the different with the first embodiment. FIG. 13 is a flowchart for explaining a substrate processing process as a semiconductor device manufacturing process according to the current embodiment. In addition, FIG. 7 is a view illustrating a gas supply sequence of a film forming process performed in the substrate processing process of the current embodiment.

In the film forming process of the first embodiment, both TiCl$_4$ and NH$_3$ are continuously supplied in the first film forming process (step 11) and the second film forming process (step 12). However, in a film forming process of the current embodiment, before and after a second film forming process (step 43), supplies of TiCl$_4$ and NH$_3$ into the processing chamber 201 are stopped, and gas removing processes (step 42 and step 44) are performed to remove gases remaining in the processing chamber 201.

(Step 41)

In a first film forming process (step 41) of the current embodiment, to form titanium nitride films on wafers 200 by a high-speed CVD method, TiCl$_4$ and NH$_3$ are simultaneously supplied under the same conditions as those used in step 11, step 21, and step 31 of the previous embodiments.

(Step 42)

In the gas removing process (step 42) of the current embodiment, the valves 314 and 334 of the gas supply pipes 310 and 330 are closed to stop supplies of $TiCl_4$ and $NH_3$ into the processing chamber 201, and valve 614 is opened so that $TiCl_4$ can flow to the vent line 610. In this way, supply of $TiCl_4$ into the processing chamber 201 is interrupted without stopping vaporization of $TiCl_4$ so that $TiCl_4$ can be supplied again rapidly and stably in step 43 (described later). At this time, the valve 243 of the gas exhaust pipe 231 is kept open, and the inside of the processing chamber 201 is exhausted to a pressure equal to or lower than 20 Pa by using the vacuum pump 246 so as to exhaust $TiCl_4$ and $NH_3$ remaining in the processing chamber 201. At this time, if inert gas such as $N_2$ is supplied into the processing chamber 201, the remaining $TiCl_4$ and $NH_3$ can be removed more efficiently.

(Step 43)

In the second film forming process (step 43) of the current embodiment, to form titanium nitride films on the wafers 200 by a low-speed CVD method like in step 12 of the first embodiment, the supply flow rate of $NH_3$ is not changed but only the supply flow rate of $TiCl_4$ is decreased.

(Step 44)

In the gas removing process (step 44) of the current embodiment, the valves 314 and 334 of the gas supply pipes 310 and 330 are closed to stop supplies of $TiCl_4$ and $NH_3$ into the processing chamber 201, and valve 614 is opened so that $TiCl_4$ can flow to the vent line 610. In this way, supply of $TiCl_4$ into the processing chamber 201 is interrupted without stopping vaporization of $TiCl_4$ so that $TiCl_4$ can be supplied again rapidly and stably when the step 41 is performed again. At this time, the valve 243 of the gas exhaust pipe 231 is kept open, and the inside of the processing chamber 201 is exhausted to a pressure equal to or lower than 20 Pa by using the vacuum pump 246 so as to exhaust $TiCl_4$ and $NH_3$ remaining in the processing chamber 201. At this time, if inert gas such as $N_2$ is supplied into the processing chamber 201, the remaining $TiCl_4$ and $NH_3$ can be removed more efficiently.

The above-described step 41 to step 44 are set as one cycle, and the cycle is performed at least once so that while removing gases from the processing chamber 201, titanium nitride films can be formed on the wafers 200 to a predetermined thickness by a plurality of different CVD methods.

According to the current embodiment, in step 43, $NH_3$ is excessively supplied as compared with $TiCl_4$ so as to attain effects such as removal of Cl from titanium nitride films and improve the film quality. It may be preferable that the supply rate of $NH_3$ is higher than the supply flow rate of $TiCl_4$.

Furthermore, in the case where film formation is repeated while varying the supply ratio of $NH_3$ to $TiCl_4$, since the quality of titanium nitride films formed during a low pulse of the supply ratio (step 41) is improved by an excessive amount of $NH_3$ supplied during a high pulse of the supply ratio (step 43), the overall film quality can be uniformly maintained (with less unevenness) by controlling the supply flow rates of gases.

In addition, according to the current embodiment, introduction of reactive gases (source gases) is stopped at intervals (step 42 and step 44) when CVD film forming processes (step 41 and step 43) are performed under different conditions, so that reaction products can be efficiently discharged to the outside of the processing chamber 201. In the current embodiment, reaction products can be discharged more efficiently as compared with the third embodiment, and thus effects such as reduction of residue Cl and reduction of contaminants can be attained. In addition, separation of two kinds of CVD conditions reduces the possibility of formation of an asymptotical titanium nitride film the quality of which cannot be controlled when a flow rate is changed, and thus the film quality can be effectively controlled. However, since films are not formed during the intervals (step 42 and step 44), throughput may be decreased. Which of the embodiments is optimal may be determined by the balance between film quality requirements and throughput requirement.

Fifth Embodiment

Figure 8:
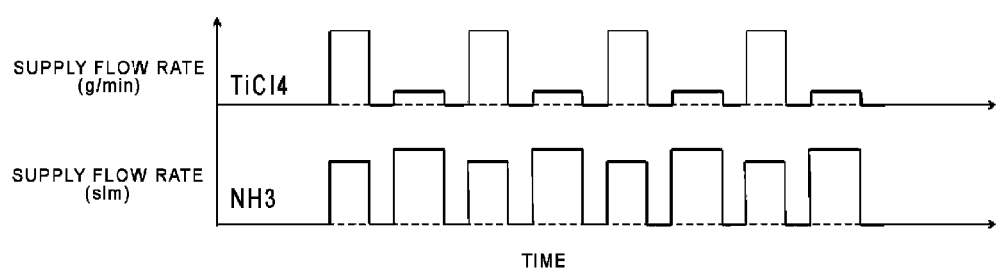
FIG. 8 is a view illustrating a gas supply sequence of a film forming process according to a fifth embodiment of the present invention.
Figure 14:
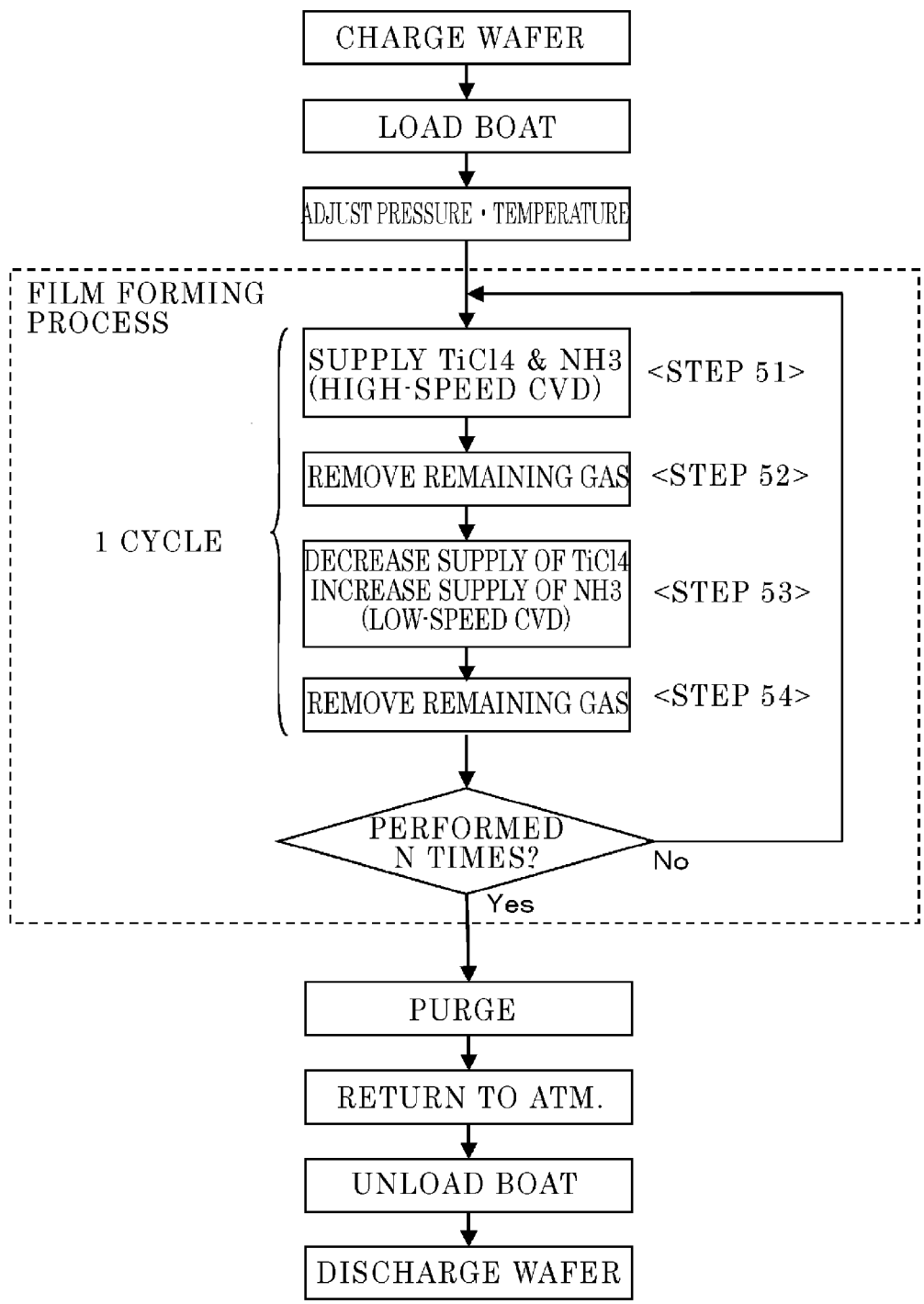
FIG. 14 is a flowchart for explaining a substrate processing process according to the fifth embodiment of the present invention.

In the description of the current embodiment, an explanation will be given on the different with the second embodiment. FIG. 14 is a flowchart for explaining a substrate processing process as a semiconductor device manufacturing process according to the current embodiment. In addition, FIG. 8 is a view illustrating a gas supply sequence of a film-forming process performed in the substrate processing process of the current embodiment.

In the film forming process of the second embodiment, both $TiCl_4$ and $NH_3$ are continuously supplied in the first film forming process (step 21) and the second film forming process (step 22). However, in a film forming process of the current embodiment, before and after a second film forming process (step 53), supplies of $TiCl_4$ and $NH_3$ into the processing chamber 201 are stopped, and gas removing processes (step 52 and step 54) are performed to remove gases remaining in the processing chamber 201 (this is the same as in the fourth embodiment). In the second film forming process (step 53) of the current embodiment, like the second embodiment, the supply flow rate of $TiCl_4$ is decreased but the supply flow rate of $NH_3$ is increased to execute a low-speed CVD method (this is different from the fourth embodiment).

(Step 51)

In a first film forming process (step 51) of the current embodiment, to form titanium nitride films on wafers 200 by using a high-speed CVD method, $TiCl_4$ and $NH_3$ are simultaneously supplied under the same conditions as those used in step 11, step 21, and step 31 of the previous embodiments.

(Step 52)

In the gas removing position (step 52) of the current embodiment, the valves 314 and 334 of the gas supply pipes 310 and 330 are closed to stop supplies of $TiCl_4$ and $NH_3$ into the processing chamber 201, and valve 614 is opened so that $TiCl_4$ can flow to the vent line 610. In this way, supply of $TiCl_4$ into the processing chamber 201 is interrupted without stopping vaporization of $TiCl_4$ so that $TiCl_4$ can be supplied again rapidly and stably in step 53 (described later). At this time, the valve 243 of the gas exhaust pipe 231 is kept open, and the inside of the processing chamber 201 is exhausted to a pressure equal to or lower than 20 Pa by using the vacuum pump 246 so as to exhaust $TiCl_4$ and $NH_3$ remaining in the processing chamber 201. At this time, if inert gas such as $N_2$ is supplied into the processing chamber 201, the remaining $TiCl_4$ and $NH_3$ can be removed more efficiently.

(Step 53)

In the second film forming process (step 53) of the current embodiment, to form titanium nitride films on the wafers 200 by a low-speed CVD method like in step 22 of the second embodiment, $TiCl_4$ and $NH_3$ are supplied into the processing chamber 201 in a state where the supply flow rate of TiCl$_4$ is decreased as compared with that in step 51 and the supply flow rate of NH$_3$ is increased as compared with that in step 51.

(Step 54)

In the gas removing process (step 54) of the current embodiment, the valves 314 and 334 of the gas supply pipes 310 and 330 are closed to stop supplies of TiCl$_4$ and NH$_3$ into the processing chamber 201, and valve 614 is opened so that TiCl$_4$ can flow to the vent line 610. In this way, supply of TiCl$_4$ into the processing chamber 201 is interrupted without stopping vaporization of TiCl$_4$ so that TiCl$_4$ can be supplied again rapidly and stably when the step 51 is performed again. At this time, the valve 243 of the gas exhaust pipe 231 is kept open, and the inside of the processing chamber 201 is exhausted to a pressure equal to or lower than 20 Pa by using the vacuum pump 246 so as to exhaust TiCl$_4$ and NH$_3$ remaining in the processing chamber 201. At this time, if inert gas such as N$_2$ is supplied into the processing chamber 201, the remaining TiCl$_4$ and NH$_3$ can be removed more efficiently.

The above-described step 51 to step 54 are set as one cycle, and the cycle is performed at least once so that while removing gases from the processing chamber 201, titanium nitride films can be formed on the wafers 200 to a predetermined thickness by a plurality of different CVD methods.

According to the current embodiment, in step 53, NH$_3$ is excessively supplied as compared with TiCl$_4$ to attain effects such as removal of Cl from titanium nitride films and improve the film quality. It may be preferable that the supply rate of NH$_3$ is higher than the supply flow rate of TiCl$_4$. Furthermore, in the case where film formation is repeated while varying the supply ratio of NH$_3$ to TiCl$_4$, since the quality of titanium nitride films formed during a low pulse of the supply ratio (step 51) is improved by an excessive amount of NH$_3$ supplied during a high pulse of the supply ratio (step 53), the overall film quality can be uniformly maintained (with less unevenness) by controlling the supply flow rates of gases.

In addition, according to the current embodiment, like in the fourth embodiment, introduction of reactive gases (source gases) is stopped at intervals (step 52 and step 54) when CVD film forming processes (step 51 and step 53) are performed under different conditions, so that reaction products can be efficiently discharged to the outside of the processing chamber 201. In this way, substances such as Cl can be prevented from remaining in the titanium nitride films.

Sixth Embodiment

Figure 9:
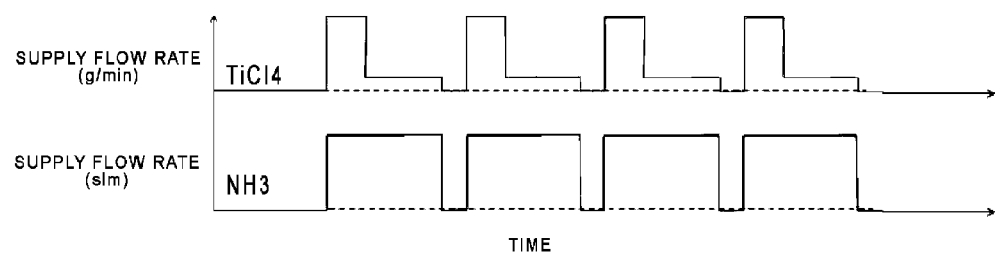
FIG. 9 is a view illustrating a gas supply sequence of a film forming process according to a sixth embodiment of the present invention.
Figure 15:
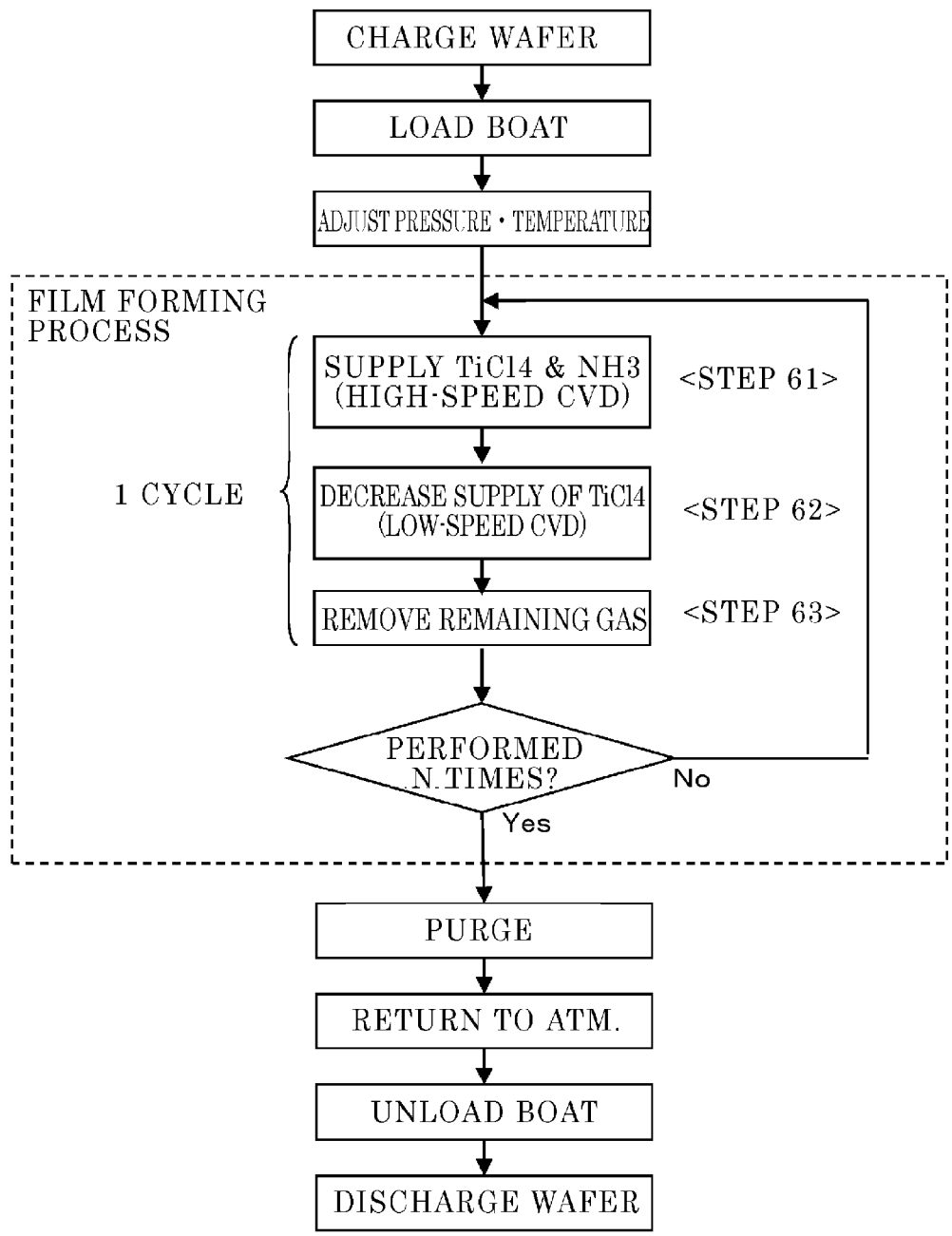
FIG. 15 is a flowchart for explaining a substrate processing process according to the sixth embodiment of the present invention.

In the description of the current embodiment, an explanation will be given on the different with the first embodiment. FIG. 15 is a flowchart for explaining a substrate processing process as a semiconductor device manufacturing process according to the current embodiment. In addition, FIG. 9 is a view illustrating a gas supply sequence of a film-forming process performed in the substrate processing process of the current embodiment.

In the film forming process of the first embodiment, the second film forming process (step 11) and the second film forming process (step 12) are set as one cycle, and the cycle is performed predetermined times. However, in the current embodiment, after a first film forming process (step 61) and a second film forming process (step 62) are performed, a gas removing process (step 63) is performed by stopping supplies of TiCl$_4$ and NH$_3$ into the processing chamber 201 and removing gases remaining in the processing chamber 201. The step 61 to step 63 are set as one cycle, and the cycle is performed predetermined times. This is different from the first embodiment.

(Step 61)

In the first film forming process (step 61) of the current embodiment, to form titanium nitride films on wafers 200 by a high-speed CVD method like in step 11 of the first embodiment, TiCl$_4$ and NH$_3$ are simultaneously supplied into the processing chamber 201.

(Step 62)

In the second film forming process (step 62) of the current embodiment, to form titanium nitride films on the wafers 200 by a low-speed CVD method like in step 22 of the second embodiment, TiCl$_4$ and NH$_3$ are supplied into the processing chamber 201 in a state where the supply flow rate of TiCl$_4$ is decreased as compared with that in step 61 and the supply flow rate of NH$_3$ is not changed as compared with that in step 61.

(Step 63)

In the gas removing process (step 63) of the current embodiment, the valves 314 and 334 of the gas supply pipes 310 and 330 are closed to stop supplies of TiCl$_4$ and NH$_3$ into the processing chamber 201, and valve 614 is opened so that TiCl$_4$ can flow to the vent line 610. In this way, supply of TiCl$_4$ into the processing chamber 201 is interrupted without stopping vaporization of TiCl$_4$ so that TiCl$_4$ can be supplied again rapidly and stably when the step 61 and step 62 are performed again. At this time, the valve 243 of the gas exhaust pipe 231 is kept open, and the inside of the processing chamber 201 is exhausted to a pressure equal to or lower than 20 Pa by using the vacuum pump 246 so as to exhaust TiCl$_4$ and NH$_3$ remaining in the processing chamber 201. At this time, if inert gas such as N$_2$ is supplied into the processing chamber 201, the remaining TiCl$_4$ and NH$_3$ can be removed more efficiently.

The above-described step 61 to step 63 are set as one cycle, and the cycle is performed at least once so that while removing gases from the processing chamber 201, titanium nitride films can be formed on the wafers 200 to a predetermined thickness by a plurality of different CVD methods.

According to the current embodiment, in step 62, NH$_3$ is excessively supplied as compared with TiCl$_4$ so as to attain effects such as removal of Cl from titanium nitride films and improve the film quality. It may be preferable that the supply rate of NH3 is higher than the supply flow rate of TiCl$_4$. Furthermore, in the case where film formation is repeated while varying the supply ratio of NH$_3$ to TiCl$_4$, since the quality of titanium nitride films formed during a low pulse of the supply ratio (step 61) is improved by an excessive amount of NH$_3$ supplied during a high pulse of the supply ratio (step 62), the overall film quality can be uniformly maintained (with less unevenness) by controlling the supply flow rates of gases.

In addition, according to the current embodiment, like in the fourth embodiment, introduction of reactive gases (source gases) is stopped at intervals (step 62) while CVD film forming processes (step 61 and step 62) are repeated under different conditions, thereby making it possible to attaining effects such as efficient discharging of reaction products to the outside of the processing chamber 201. In the case of removing remaining gases, disadvantageously, throughput may be decreased. However, like the current embodiment, if the gas removing process is performed once (that is, if the gas removing process is performed only after the step 62 instead of performing the gas removing process after the step 61 the step 62, respectively), throughput may be less decreased. Which of the embodiments is optimal may be determined by the balance between film quality requirements and throughput requirement.

In addition, when a titanium nitride film is formed by a high-speed CVD method, $TiCl_4$ may be supplied to the gas supply pipe 320 as well as the gas supply pipe 310 to supply the $TiCl_4$ into the processing chamber 201 both through the nozzles 410 and 420.

By repeating formation of a titanium nitride film by a high-speed CVD method and formation of a titanium nitride film by a low-speed CVD method, a titanium nitride film, the quality of which is good like in the case where a titanium nitride film is formed by an atomic layer deposition (ALD) method, can be formed at high throughput.

In addition, by forming a titanium nitride film by a low-speed CVD method on a titanium nitride film formed by a high-speed CVD method, the under-laying high-speed CVD titanium nitride film can be modified, and thus a denser continuous film can be formed.

Furthermore, according to the current embodiment, while maintaining the productivity, the quality of a titanium nitride film can be improved, for example, by reducing the resistance and chlorine (Cl) concentration of the titanium nitride film.

In the above description, a vertical batch type apparatus has been mainly described. However, when a titanium nitride film is formed by at least two different CVD methods according to the current embodiment, instead of the vertical batch type apparatus, other apparatuses such as a horizontal apparatus and a single wafer type apparatus can be used.

Furthermore, in the above description, a vertical thermal CVD apparatus has been mainly described. However, when a titanium nitride film is formed by at least two different CVD methods according to the current embodiment, instead of the vertical thermal CVD apparatus, other apparatuses such as a plasma CVD apparatus and an optical CVD apparatus can be used.

Furthermore, although explanations have been given mainly on titanium nitride films, the present invention is not limited thereto. That is, the present invention can be applied to other kinds of films. For example, the present invention can be applied to the case where a conductive film (such as Ti, TiN, TiAlN, TiSiN, Ta, TaN, TaSiN, Al, Cu, Mn, MnO, Ru, W, GeSb, or GeSbTe film) or an insulating film (such as HfO, HfON, HfSiO, HfSiON, HfAlO, HfAlON, ZrO, AlO, or AlN film) is formed on a substrate (wafer) by using a metal halide compound or an organic metal compound as a source. In addition, for example, the present invention can be applied to the case where a Si-based film is formed on a substrate by using a Si-based halide (such as dichlorosilane (DCS) and hexachlorodisilane (HCD)) or a Si-based organic material (such as tetraethyl orthosilicate (TEOS) and tetrakis (dimethylamido)titanium (TDMAT)).

In addition, the present invention can be applied to the case of using a source including at least one of Ti, Al, Si, Ta, Cu, Mn, Ru, W, Ge, Sb, Te, Hf, and Zr. Furthermore, as a source for modifying a film including a part of a metal halide compound or a metal organic compound formed on a substrate, an O-containing source or a N-containing source may be used as well as $NH_3$. For example, one of $N_2$, $N_2O$, $CH_6N_2$, $O_2$, $O_3$, $H_2O$, $H_2O_2$, and $H_2$ may be used.

According to the present invention, a titanium nitride film, the quality of which is better than the quality of a titanium nitride film formed by a conventional CVD method, can be formed at a higher growth rate than the growth rate of a titanium nitride film formed by a conventional ALD method. That is, a titanium nitride film can be formed with high productivity.

[Supplementary Note]

The present invention also includes the following preferred embodiments.

(Supplementary Note 1)

According to an embodiment of the present invention, there is provided an apparatus for forming a thin film on a substrate by a reaction between two or more kinds of gases, wherein at least one of the gases is supplied into a chamber in a pulse pattern, and two or more kinds of pulses are used in a series of film forming sequences to form a thin film.

(Supplementary Note 2)

Preferably, the apparatus may be a batch type apparatus configured to process five or more substrates at a time.

(Supplementary Note 3)

Preferably, the apparatus may comprise two kinds of gas introducing units configured to supply at least one kind of gas into the chamber.

(Supplementary Note 4)

Preferably, the gas introducing units may be two or more nozzles.

(Supplementary Note 5)

Preferably, the nozzles may be multi-hole nozzles having different hole diameters.

(Supplementary Note 6)

Preferably, the thin film may be a metal compound film.

(Supplementary Note 7)

Preferably, the thin film may be a titanium nitride (TiN) film.

(Supplementary Note 8)

Preferably, the gases may comprise $TiCl_4$ and $NH_3$.

(Supplementary Note 9)

Preferably, $TiCl_4$ may be supplied by using the two or more kinds of pulses in the series of film forming sequences.

(Supplementary Note 10)

Preferably, the apparatus may perform a batch process to process five or more substrates at a time.

(Supplementary Note 11)

Preferably, when at least one kind of gas is supplied into the chamber, the gas may be supplied through two or more kinds of nozzles having different shapes.

(Supplementary Note 12)

Preferably, the thin film may be a metal compound film.

(Supplementary Note 13)

Preferably, the thin film may be a titanium nitride (TiN) film.

(Supplementary Note 14)

According to another embodiment of the present embodiment, there is provided a method of manufacturing a semiconductor device by simultaneously supplying two or more kinds of sources into a processing chamber to form a film on a substrate placed in the processing chamber, the method comprising: performing a first source supply process by supplying at least one kind of source into the processing chamber at a first supply flow rate; and performing a second source supply process by supplying the at least one kind of source into the processing chamber at a second supply flow rate different from the first supply flow rate.

(Supplementary Note 15)

According to another embodiment of the present invention, there is provided a method of manufacturing a semiconductor device by simultaneously supplying two or more kinds of sources into a processing chamber to form a film on a substrate placed in the processing chamber, the method comprising: performing a first film forming process to form a film on the substrate by supplying a second source into the processing chamber at a second supply flow rate while supplying a first source into the processing chamber at a first supply flow rate; and performing a second film forming process to form a film on the substrate by supplying the second source into the processing chamber at the second supply flow rate while supplying the first source into the processing chamber at a third supply flow rate different form the first supply flow rate.

(Supplementary Note 16)
Preferably, the first film forming process and the second film forming process may be consecutively performed.

(Supplementary Note 17)
Preferably, the first film forming process and the second film forming process may be alternately performed a plurality of times.

(Supplementary Note 18)
Preferably, the third supply flow rate may be lower than the first supply flow rate.

(Supplementary Note 19)
Preferably, the third supply flow rate may be lower than the second supply flow rate.

(Supplementary Note 20)
Preferably, the first source may include at least one of Ti, Al, Si, Ta, Cu, Mn, Ru, W, Ge, Sb, Te, Hf, and Zr.

(Supplementary Note 21)
Preferably, the first source may be a halogen compound or an organic compound.

(Supplementary Note 22)
Preferably, the first source may be a halogen-containing metal compound or an organic metal compound.

(Supplementary Note 23)
Preferably, the first source may be a halogen-containing Si compound or an organic Si compound.

(Supplementary Note 24)
Preferably, the second source may an O-containing source or a N-containing source.

(Supplementary Note 25)
Preferably, the second source may be $NH_3$, $N_2$, $N_2O$, $CH_6N_2$, $O_2$, $O_3$, $H_2O$, $H_2O_2$, or $H_2$.

(Supplementary Note 26)
Preferably, the film may be a conductive film or an insulating film.

(Supplementary Note 27)
Preferably, the film may be one of a Ti film, a TiN film, a TiAlN film, a TiSiN film, a Ta film, a TaN film, a TaSiN film, an Al film, a Cu film, a Mn film, a MnO film, a Ru film, a W film, a GeSb film, a GeSbTe film, a HfO film, a HfON film, a HfSiO film, a HfSiON film, a HfAlO film, a HfAlON film, a ZrO film, an AlO film, a MN film, a TiO film, a SiN film, and a SiO film.

(Supplementary Note 28)
According to another embodiment of the present invention, there is provided a method of manufacturing a semiconductor device by simultaneously supplying two or more kinds of sources into a processing chamber to form a film on a substrate placed in the processing chamber, the method comprising: performing a first film forming process to form a film on the substrate by supplying a second source into the processing chamber at a second supply flow rate while supplying a first source into the processing chamber at a first supply flow rate; and performing a second film forming process to form a film on the substrate by supplying the second source into the processing chamber at a fourth supply flow rate different from the second supply flow rate while supplying the first source into the processing chamber at a third supply flow rate different form the first supply flow rate.

(Supplementary Note 29)
Preferably, the first film forming process and the second film forming process may be consecutively performed.

(Supplementary Note 30)
Preferably, the first film forming process and the second film forming process may be alternately performed a plurality of times.

(Supplementary Note 31)
Preferably, the third supply flow rate may be lower than the first supply flow rate, and the fourth supply flow rate may be higher than the second supply flow rate.

(Supplementary Note 32)
Preferably, the third supply flow rate may be lower than the fourth supply flow rate.

(Supplementary Note 33)
According to another embodiment of the present invention, there is provided a method of manufacturing a semiconductor device by simultaneously supplying two or more kinds of sources into a processing chamber to form a film on a substrate placed in the processing chamber, the method comprising: performing a first film forming process to form a film on the substrate by supplying a second source into the processing chamber at a second supply flow rate while supplying a first source into the processing chamber at a first supply flow rate; performing a second film forming process to form a film on the substrate by supplying the second source into the processing chamber at a fourth supply flow rate lower than the second supply flow rate while supplying the first source into the processing chamber at a third supply flow rate lower than the first supply flow rate; performing a third film forming process to form a film on the substrate by supplying the second source into the processing chamber at a fifth supply flow rate higher than the second supply flow rate while supplying the first source into the processing chamber at the third supply flow rate; and performing a fourth film forming process to form a film on the substrate by supplying the second source into the processing chamber at the fourth supply flow rate while supplying the first source into the processing chamber at the third supply flow rate.

(Supplementary Note 34)
According to another embodiment of the present invention, there is provided a method of manufacturing a semiconductor device by simultaneously supplying two or more kinds of sources into a processing chamber to form a film on a substrate placed in the processing chamber, the method comprising: performing a first film forming process to form a film on the substrate by supplying at least one kind of source into the processing chamber at a first supply flow rate; performing a second film forming process to form a film on the substrate by supplying the at least one kind of source into the processing chamber at a second supply flow rate different from the first supply flow rate; and performing a source removing process to remove the two or more kinds of sources from the processing chamber.

(Supplementary Note 35)
According to another embodiment of the present invention, there is provided a method of manufacturing a semiconductor device by simultaneously supplying two or more kinds of sources into a processing chamber to form a film on a substrate placed in the processing chamber, the method comprising: loading the substrate into the processing chamber; and supplying at least one kind of source into the processing chamber in a pattern of continuous pulses of two different supply flow rates.

(Supplementary Note 36)
According to another embodiment of the present invention, there is provided a substrate processing apparatus comprising: a processing chamber configured to accommodate a substrate; a source supply unit configured to simultaneously supply a plurality of sources into the processing chamber for forming a film on the substrate; and a control unit configured to control the source supply unit for forming a film on the substrate by supplying at least one kind of source into the processing chamber at a first supply flow rate and then supplying the at least one kind of source at a second supply flow rate different from the first supply flow rate.

(Supplementary Note 37)

According to another embodiment of the present invention, there is provided a substrate processing apparatus comprising: a processing chamber configured to accommodate a substrate; a source supply unit configured to simultaneously supply a plurality of sources into the processing chamber for forming a film on the substrate; and a control unit configured to control the source supply unit for supplying at least one kind of source into the processing chamber in a pattern of continuous pulses of two different supply flow rates.

(Supplementary Note 38)

According to another embodiment of the present invention, there is provided a semiconductor device manufactured (formed) by a semiconductor device manufacturing method in which two or more kinds of sources are simultaneously supplied into a processing chamber to form a film on a substrate placed in the processing chamber, the method comprising: performed a first source supply process by supplying at least one kind of source into the processing chamber at a first supply flow rate; and performing a second source supply process by supplying the at least one kind of source into the processing chamber at a second supply flow rate different from the first supply flow rate.

(Supplementary Note 39)

According to another embodiment of the present invention, there is provided a semiconductor device manufactured (formed) by a semiconductor device manufacturing method in which two or more kinds of sources are simultaneously supplied into a processing chamber to form a film on a substrate placed in the processing chamber, the method comprising: loading the substrate into the processing chamber; and supplying at least one kind of source into the processing chamber in a pattern of continuous pulses of two different supply flow rates.

What is claimed is:

1. A method of manufacturing a semiconductor device by simultaneously supplying a first source gas and a second source gas into a processing chamber to form a film on a substrate placed in the processing chamber, the method comprising:
   (a) supplying the second source gas into the processing chamber at a second flow rate while supplying the first source gas into the processing chamber at a first flow rate to form a first film on the substrate;
   (b) supplying the second source gas into the processing chamber at a fourth flow rate lower than the second flow rate while supplying the first source gas into the processing chamber at a third flow rate lower than the first flow rate to form a second film on the substrate;
   (c) supplying the second source gas into the processing chamber at a fifth flow rate greater than the second flow rate while supplying the first source gas into the processing chamber at the third flow rate to form a third film on the substrate; and
   (d) supplying the second source gas into the processing chamber at the fourth flow rate while supplying the first source gas into the processing chamber at the third flow rate to form a fourth film on the substrate,
   wherein the step (a) through the step (d) are sequentially performed.

2. The method of claim 1, further comprising:
   (e) removing the first source gas and the second source gas from the processing chamber.

3. The method of claim 1, wherein the film comprises one selected from a group consisting of HfO, HfON, HfSiO, HfSiON, HfAlO, HfAlON, ZrO, AlO, and AlN film.

4. The method of claim 1, wherein the first source gas comprises at least one selected from a group consisting of Ti, Al, Si, Ta, Cu, Mu, Ru, W, Ge, Sb, Te, Hf, and Zr.

5. The method of claim 1, wherein the second source gas comprises one selected from a group consisting of an oxygen-containing gas and a nitrogen-containing gas.

6. The method of claim 1, wherein the second source gas comprises one selected from a group consisting of $N_2$, $N_2O$, $CH_6N_2$, $O_2$, $O_3$, $H_2O$, $H_2O_2$, $NH_3$, and $H_2$.

* * * * *